United States Patent
Chang et al.

(10) Patent No.: US 12,381,145 B2
(45) Date of Patent: Aug. 5, 2025

(54) SIGNAL CONDUCTING LINE ARRANGEMENTS IN INTEGRATED CIRCUITS

(71) Applicant: TAIWAN SEMICONDUCTOR MANUFACTURING COMPANY, LTD., Hsinchu (TW)

(72) Inventors: Wei-Ling Chang, Hsinchu (TW); Chih-Liang Chen, Hsinchu (TW); Chia-Tien Wu, Hsinchu (TW); Guo-Huei Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/447,682

(22) Filed: Aug. 10, 2023

(65) Prior Publication Data
US 2023/0402374 A1  Dec. 14, 2023

Related U.S. Application Data

(62) Division of application No. 17/446,022, filed on Aug. 26, 2021, now Pat. No. 11,916,017.

(51) Int. Cl.
*H01L 23/528* (2006.01)
*H01L 23/522* (2006.01)
*H10D 84/01* (2025.01)
*H10D 84/03* (2025.01)

(52) U.S. Cl.
CPC ........ *H01L 23/528* (2013.01); *H01L 23/5226* (2013.01); *H10D 84/0186* (2025.01); *H10D 84/038* (2025.01)

(58) Field of Classification Search
CPC ...... H10D 89/10; H10D 84/85; H10D 84/975; H10D 84/998; H10D 84/907; H10D 84/0186; H10D 84/038; H01L 23/538; H01L 23/528; H01L 21/823871; H01L 23/5226; H01L 2027/11875; H01L 27/0207; H01L 27/092; H01L 27/11807; H01L 27/11898
See application file for complete search history.

(56) References Cited

U.S. PATENT DOCUMENTS 7,260,442 B2  8/2007  Hwang et al.
9,256,709 B2  2/2016  Yu et al.
(Continued)

*Primary Examiner* — Galina G Yushina
(74) *Attorney, Agent, or Firm* — Hauptman Ham, LLP

(57) ABSTRACT

A method includes fabricating semiconductor structures extending in a first direction and fabricating gate-conductors extending in a second direction intersecting the semiconductor structure. The method also includes patterning a first metal layer to form horizontal conducting lines extending in the first direction, and patterning the second metal layer to form vertical conducting lines extending in the second direction. A first vertical conducting line is aligned with a first gate-conductor underneath and a second vertical conducting line is aligned with a vertical boundary of a circuit cell. The first vertical conducting line is directly connected to a first horizontal conducting line through a first pin-connector, and the second vertical conducting line is directly connected to a second horizontal conducting line through a second pin-connector.

20 Claims, 25 Drawing Sheets

(56) References Cited

U.S. PATENT DOCUMENTS

| | | | |
|---|---|---|---|
| 2006/0102934 A1* | 5/2006 | Kanno | H01L 27/0207 257/206 |
| 2011/0235407 A1* | 9/2011 | Lim | H10B 10/00 257/E23.141 |
| 2014/0040838 A1 | 2/2014 | Liu et al. | |
| 2015/0278429 A1 | 10/2015 | Chang | |
| 2016/0005764 A1* | 1/2016 | Masuoka | H01L 29/78642 257/329 |
| 2016/0063163 A1* | 3/2016 | Moroz | G06F 30/392 716/110 |
| 2019/0131230 A1* | 5/2019 | Guo | H01L 21/4846 |
| 2019/0206861 A1* | 7/2019 | Beigel | H10B 99/00 |
| 2020/0042668 A1* | 2/2020 | Peng | H01L 23/535 |
| 2020/0082045 A1 | 3/2020 | Lee | |
| 2021/0224458 A1* | 7/2021 | Guo | H01L 23/50 |

\* cited by examiner

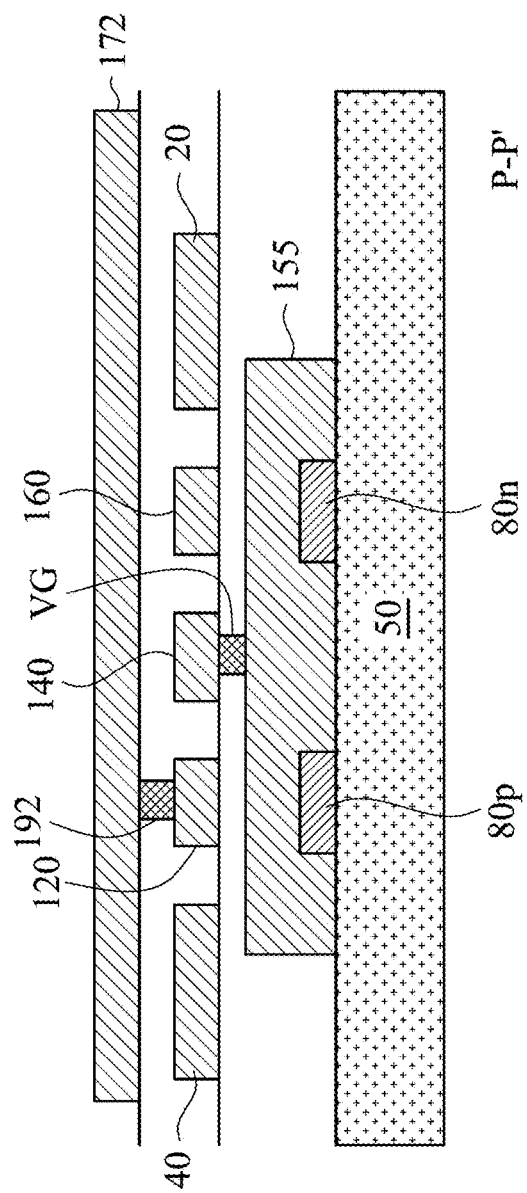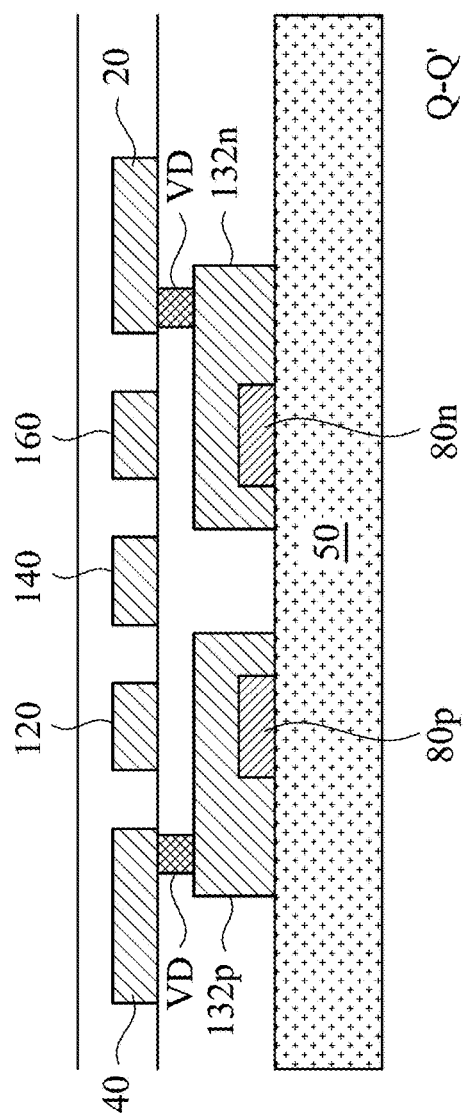

SIGNAL CONDUCTING LINE ARRANGEMENTS IN INTEGRATED CIRCUITS

PRIORITY CLAIM

The present application is a divisional of U.S. application Ser. No. 17/446,022, filed Aug. 26, 2021, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1C-1G are cross-sectional views of the inverter circuit as specified by the layout diagram in FIG. 1A, in accordance with some embodiments.

DETAILED DESCRIPTION

Figure 1A:
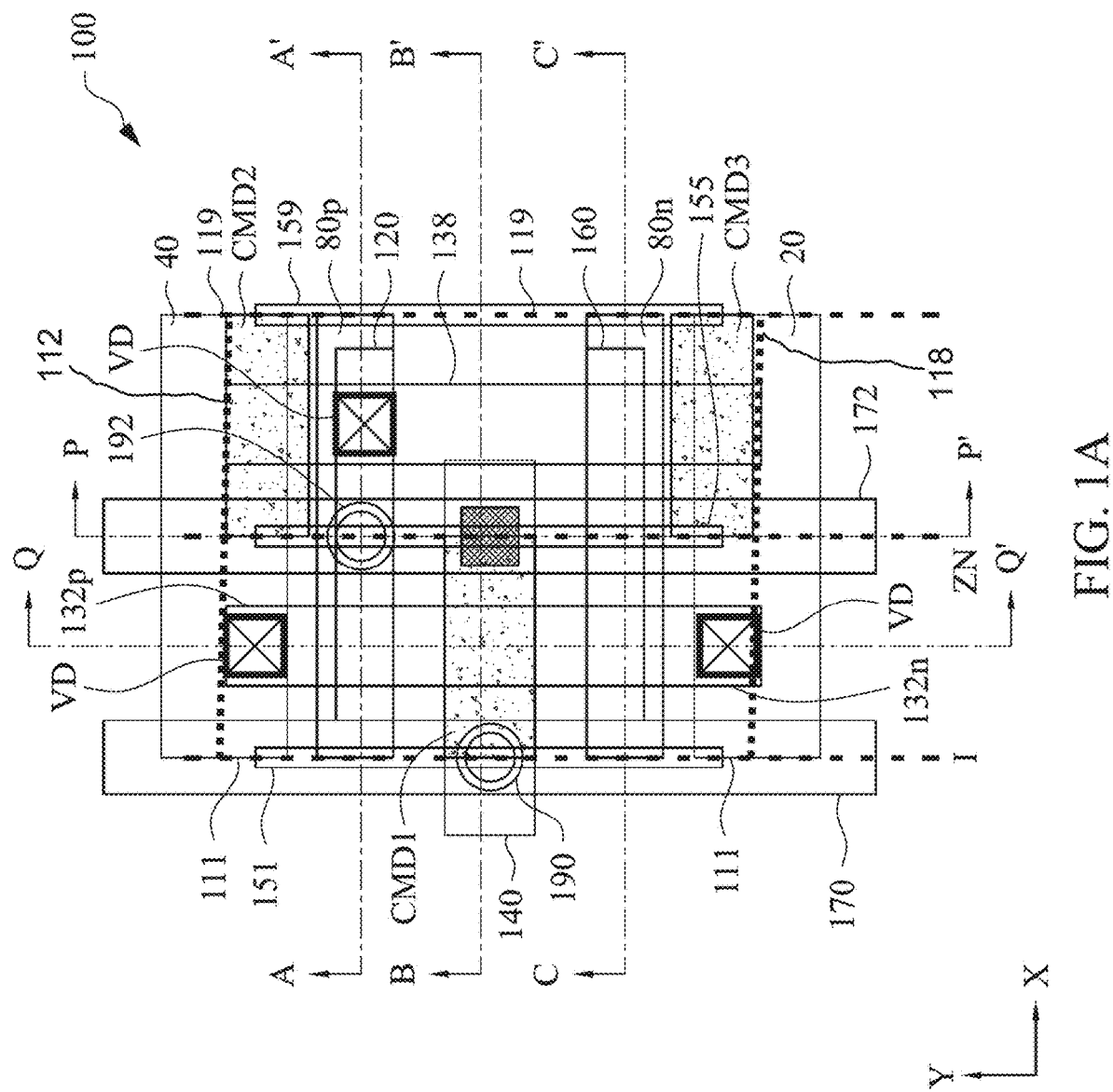
FIG. 1A is a layout diagram of an inverter circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit device generally includes transistors and signal conducting lines in various connection layers. The channel regions, the source regions, and the drain regions of the transistors are often aligned within the active zones extending in a first direction, while the gate-conductors intersecting the channel regions of the transistors extend in a second direction that is perpendicular to the first direction. The terminal-conductors intersecting the source regions or the drain regions of the transistors also extend in the second direction. In some embodiments, the integrated circuit device includes horizontal conducting lines in the first connection layer (e.g., metal layer M0) and vertical conducting lines in the second connection layer (e.g., metal layer M1). The first connection layer is immediately above the gate-conductors and the terminal-conductors. The second connection layer is above the first connection layer and overlies the interlayer dielectric (ILD) materials separating the second connection layer and the first connection layer. Some of the horizontal conducting lines in the first connection layer are connected to one of the terminal-conductors or one of the gate-conductors. Some of the vertical conducting lines in the second connection layer are connected to one of the horizontal conducting lines in the first connection layer.

In some embodiments, the height of a circuit cell is limited by the distance between the two power rails for providing the power supplies, and the width of a circuit cell is a distance between the boundary isolation regions in the active zones. For example, as shown in each of FIG. 1A, FIG. 2A, FIG. 3A, FIG. 4A, and FIG. 5A, the cell width extending in the X-direction is bounded by two vertical cell boundaries 111 and 119, and the cell height extending in the Y-direction is bounded by two horizontal cell boundaries 112 and 118. The boundary isolation regions isolate the active regions (such as, source regions, drain regions, and channel regions) in a circuit cell from other active regions in adjacent cells. As the height of a circuit cell reduces, the number of available horizontal tracks for positioning the horizontal conducting lines is also reduced, and the signal routing flexibility becomes more limited. For example, in some embodiments, only three horizontal tracks are available for signal connections in the first connection layer (e.g., metal layer M0). In some embodiments, when each of the vertical conducting lines of the circuit cell in the second connection layer (e.g., metal layer M1) is aligned with and positioned atop one of the gate-conductors, the signal routing flexibility is improved as compared to an alternative design in which each of the vertical conducting lines in the second connection layer is atop one of the terminal-conductors. Furthermore, in some embodiments, one of the horizontal conducting lines extends and crosses over a vertical cell boundary (e.g., a dummy gate-conductor), and a vertical conducting line is atop the vertical cell boundary. When a via-connector directly connects the vertical conducting line atop the vertical cell boundary with the horizontal conducting line that crosses over the vertical cell boundary, the vertical conducting line atop the vertical cell boundary can also be used for signal connections. The vertical conducting line atop the vertical cell boundary provides more improvement to the signal routing flexibility.

FIG. 1A is a layout diagram of an inverter circuit 100, in accordance with some embodiments. The layout diagram of FIG. 1A includes layout patterns for specifying a p-type active zone 80p and an n-type active zone 80n both extending in the X-direction, a gate-conductor 155 extending in the Y-direction, terminal-conductors (132p, 132n, and 138) extending in the Y-direction, and dummy gate-conductors (151 and 159) extending in the Y-direction. The layout diagram of FIG. 1A also includes the layout patterns for specifying the power rails (40 and 20) extending in the X-direction, horizontal conducting lines (120, 140, and 160) extending in the X-direction, vertical conducting lines (170 and 172) extending in the Y-direction, and various via-connectors. The inverter circuit 100 is in a cell that is bounded by four cell boundaries. The cell width along the X-direction is bounded by two vertical cell boundaries 111 and 119 extending in the Y-direction. The cell height extending in the Y-direction is bounded by two horizontal cell boundaries 112 and 118 extending in the X-direction.

Figure 1B:
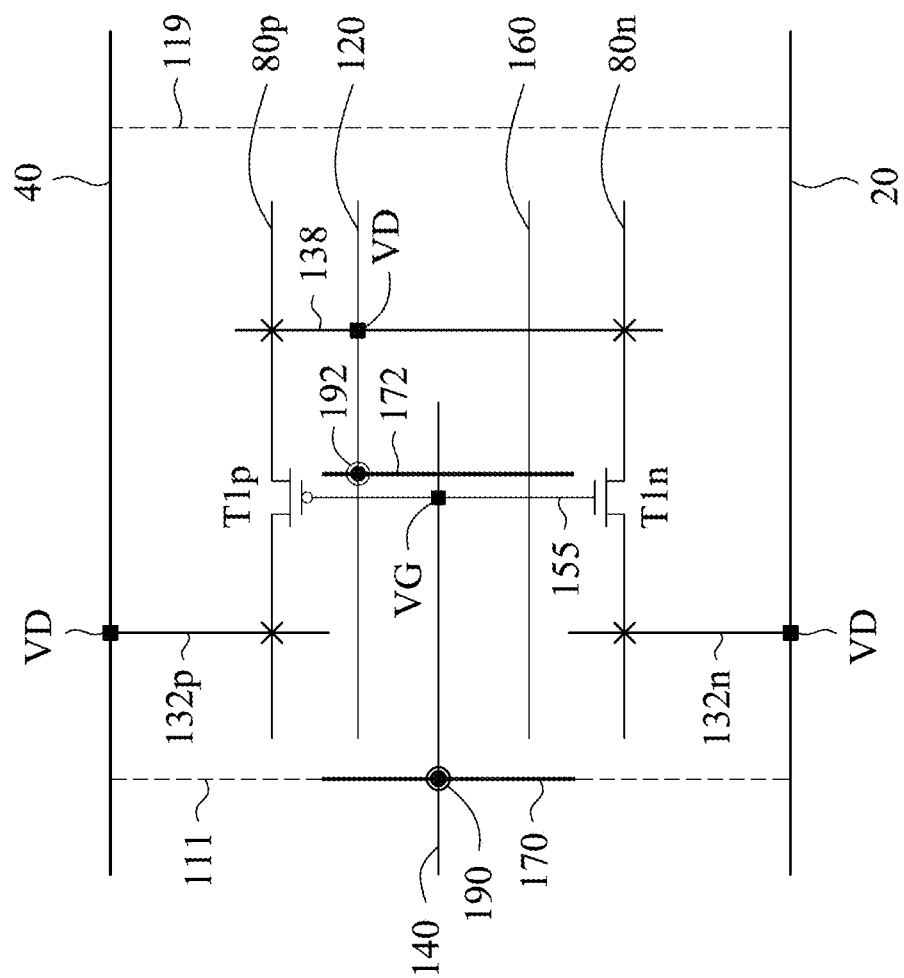
FIG. 1B is an equivalent circuit of the inverter circuit as specified by the layout diagram in FIG. 1A, in accordance with some embodiments.

FIG. 1B is an equivalent circuit of the inverter circuit 100 as specified by the layout diagram in FIG. 1A, in accordance with some embodiments. FIGS. 1C-1G are cross-sectional views of the inverter circuit 100 as specified by the layout diagram in FIG. 1A, in accordance with some embodiments.

In the inverter circuit 100 as specified by the layout diagram of FIG. 1A and as shown in the equivalent circuit of FIG. 1B, the gate-conductor 155 intersects a semiconductor structure in the p-type active zone 80p at the channel region of a p-type transistor T1p. The gate-conductor 155 also intersects a semiconductor structure in the n-type active zone 80n at the channel region of an n-type transistor T1n. The terminal-conductor 132p intersects the semiconductor structure in the p-type active zone 80p at the source region of the p-type transistor T1p. The terminal-conductor 132n intersects the semiconductor structure in the n-type active zone 80n at the source region of the n-type transistor T1n. The terminal-conductor 138 intersects the semiconductor structure in the p-type active zone 80p at the drain region of the p-type transistor T1p, and intersects the semiconductor structure in the n-type active zone 80n at the drain region of the n-type transistor T1n.

In some embodiments, when the semiconductor structure in the p-type active zone 80p and the semiconductor structure in the n-type active zone 80n are fin structures, the p-type transistor T1p and the n-type transistor T1n are FinFETs. In some embodiments, when the semiconductor structure in the p-type active zone 80p and the semiconductor structure in the n-type active zone 80n are nano-sheet structures, the p-type transistor T1p and the n-type transistor T1n are nano-sheet transistors. In some embodiments, when the semiconductor structure in the p-type active zone 80p and the semiconductor structure in the n-type active zone 80n are nano-wire structures, the p-type transistor T1p and the n-type transistor T1n are nano-wire transistors. In FIG. 1A, the layout patterns for the dummy gate-conductors 151 and 159 at the vertical cell boundaries of the inverter circuit 100 specify that the p-type active zone 80p and the n-type active zone 80n do not extend into adjacent cells. That is, none of the source regions, drain regions, and channel regions in the p-type active zone 80p and the n-type active zone 80n joins with other active regions (such as, source regions, drain regions, and channel regions) in the adjacent cells.

In the inverter circuit 100 as specified by the layout diagram of FIG. 1A and as shown in the equivalent circuit of FIG. 1B, the horizontal conducting lines (120, 140, and 160) and the power rails (40 and 20) are positioned in a first connection layer M0, which overlies the isolation materials directly covering the gate-conductor 155 and the terminal-conductors (132p, 132n, and 138). The terminal-conductor 132p is conductively connected to the power rail 40, which is configured for providing a first supply voltage VDD. The terminal-conductor 132n is conductively connected to the power rail 20, which is configured for providing a second supply voltage VSS. The horizontal conducting line 140 is conductively connected to the gate-conductor 155 through the gate via-connector VG. The horizontal conducting line 120 is conductively connected to the terminal-conductor 138 through the via-connector VD. The horizontal conducting line 160 is not conductively connected to any gate-conductors, terminal-conductors, or other conductive elements in the inverter circuit 100.

In the inverter circuit 100 as specified by the layout diagram of FIG. 1A and as shown in the equivalent circuit of FIG. 1B, the vertical conducting lines (170 and 172) are positioned in a second connection layer M1, which overlies the interlayer dielectric (ILD) materials separating the second connection layer M1 and the first connection layer M0. Furthermore, each of the vertical conducting lines (170 and 172) overlaps with the circuit cell containing the inverter circuit 100. Generally, a vertical conducting line overlaps with a circuit cell if the vertical conducting line intersects at least one cell boundary of the circuit cell.

In the inverter circuit 100 as specified by the layout diagram of FIG. 1A and as shown in the equivalent circuit of FIG. 1B, the vertical conducting lines (170 and 172) are positioned in a second connection layer M1, The vertical conducting line 172 is conductively connected to the horizontal conducting line 120 though the via-connector 192, and the vertical conducting line 170 is conductively connected to the horizontal conducting line 140 though the via-connector 190. Each of the via-connector 190 and the via-connector 192 is a via-connector VIA0 that passes through the ILD materials separating the second connection layer M1 and the first connection layer M0. The vertical conducting line 172 is atop the gate-conductor 155, and the vertical conducting line 170 is atop the dummy gate-conductor 151. Each of the via-connectors 190 and 192 functions as a pin-connector. The vertical conducting line 170, the via-connector 190, and the horizontal conducting line 140 are conductively connected together to carry an input signal "I" of the inverter circuit 100. The vertical conducting line 172, the via-connector 192, and the horizontal conducting line 120 are conductively connected together to carry an output signal "ZN" of the inverter circuit 100.

In the layout diagram of FIG. 1A, the layout pattern CMD1 specifies that the terminal-conductor 132p and the terminal-conductor 132n are physically separated from each other, while each of the terminal-conductors 132p and 132n is specified by a portion of a same terminal-conductor pattern extending in the Y-direction and same terminal-conductor pattern is segmented by the layout pattern CMD1. The layout pattern CMD2 specifies that, in the first connection layer M0, the terminal-conductor 138 is not directly connected to the power rail 40. The layout pattern CMD3 specifies that, in the first connection layer M0, the terminal-conductor 138 is not directly connected to the power rail 20.

Figure 1C:
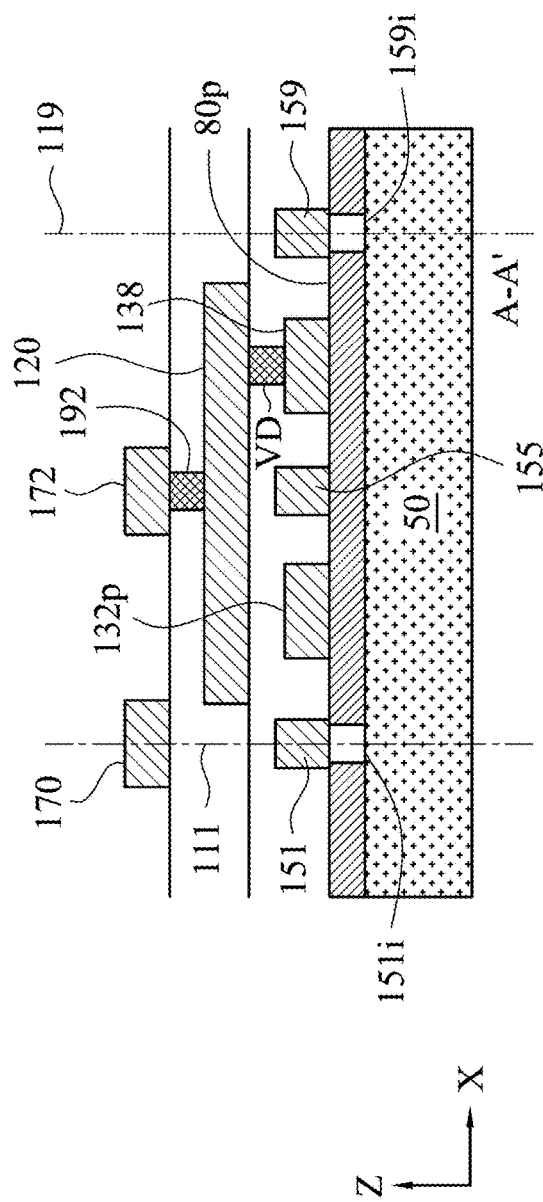

FIG. 1C is a cross-sectional view of the inverter circuit 100 as specified by FIG. 1A in a cutting plane A-A', in accordance with some embodiments. As shown in FIG. 1C, the semiconductor structure in the p-type active zone 80p is on the substrate 50. Each of the terminal-conductor 132p, the gate-conductor 155, and the terminal-conductor 138 intersects the semiconductor structure in the p-type active zone 80p. In some embodiments, the active regions (such as, the source region, the channel region, or the drain region) in the p-type active zone 80p are isolated from the active regions in the adjacent cells, by the boundary isolation region 151i under the dummy gate-conductor 151 and the boundary isolation region 159i under the dummy gate-conductor 159. The vertical conducting line 172 is conductively connected to the horizontal conducting line 120 though the via-connector 192. The horizontal conducting line 120 is conductively connected to the terminal-conductor 138 through the via-connector VD.

Figure 1D:
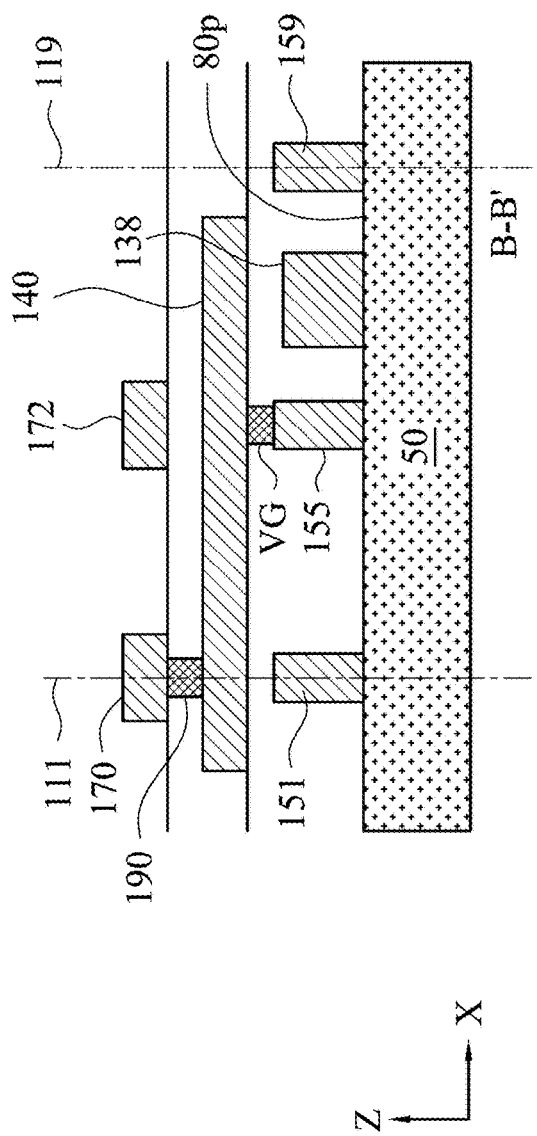

FIG. 1D is a cross-sectional view of the inverter circuit 100 as specified by FIG. 1A in a cutting plane B-B', in accordance with some embodiments. As shown in FIG. 1D, the vertical conducting line 170 is conductively connected to the horizontal conducting line 140 though the via-connector 190. The horizontal conducting line 140 is conductively connected to the gate-conductor 155 through the via-connector VG. The horizontal conducting line 140 extends in the negative X-direction and crosses over the dummy gate-conductor 151.

Figure 1E:
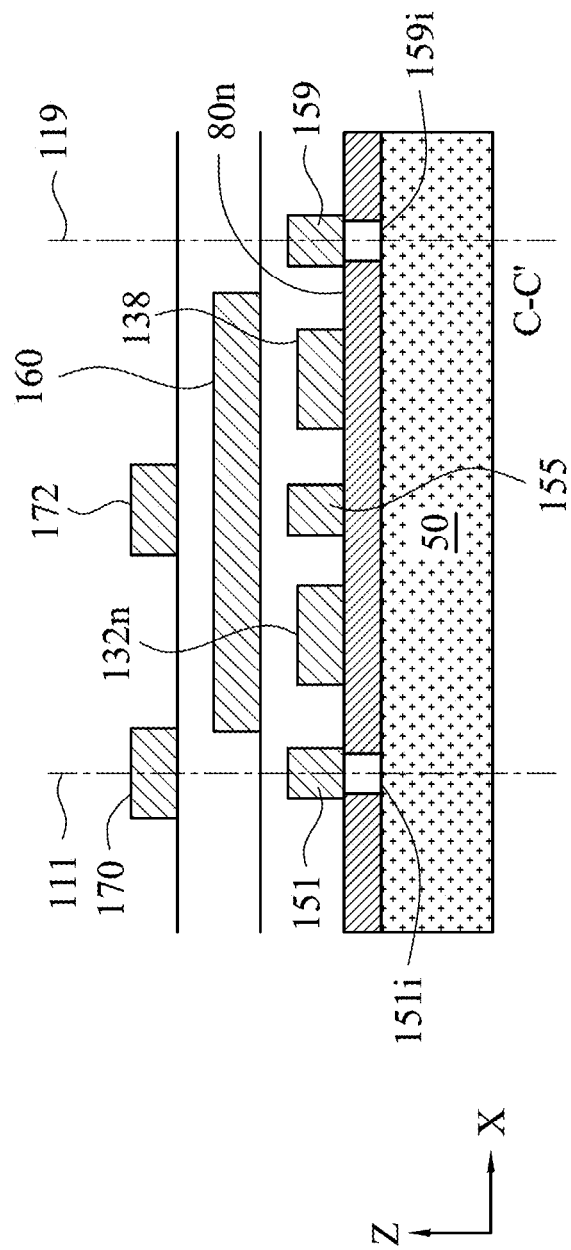

FIG. 1E is a cross-sectional view of the inverter circuit 100 as specified by FIG. 1A in a cutting plane C-C', in accordance with some embodiments. As shown in FIG. 1E, the semiconductor structure in the n-type active zone 80n is on the substrate 50. Each of the terminal-conductor 132n, the gate-conductor 155, and the terminal-conductor 138 intersects the semiconductor structure in the n-type active zone 80n. In some embodiments, the active regions (such as the source region, the channel region, or the drain region) in the n-type active zone 80n are isolated from the active regions in the adjacent cells, by the boundary isolation region 151i under the dummy gate-conductor 151 and the boundary isolation region 159i under the dummy gate-conductor 159.

FIG. 1F is a cross-sectional view of the inverter circuit 100 as specified by FIG. 1A in a cutting plane P-P', in accordance with some embodiments. FIG. 1G is a cross-sectional view of the inverter circuit 100 as specified by FIG. 1A in a cutting plane Q-Q', in accordance with some embodiments. In FIGS. 1F-1G, the power rails (40 and 20) and the horizontal conducting lines (120, 140, and 160) are in the first connection layer M0. In FIG. 1F, the gate-conductor 155 intersects both the semiconductor structure in the p-type active zone 80p and the semiconductor structure in the n-type active zone 80n. The vertical conducting line 172 is in the second connection layer M1. The vertical conducting line 172 is conductively connected to the horizontal conducting line 140 though the via-connector 192. The horizontal conducting line 140 is conductively connected to the gate-conductor 155 through the gate via-connector VG. In FIG. 1G, the terminal-conductor 132p intersects the semiconductor structure in the p-type active zone 80p at the source region of the p-type transistor T1p (which is shown in FIG. 1B), and the terminal-conductor 132n intersects the semiconductor structure in the n-type active zone 80n at the source region of the n-type transistor T1n (which is shown in FIG. 1B). The power rail 40 is conductively connected to the terminal-conductor 132p through a terminal via-connector VD, and the power rail 20 is also conductively connected to the terminal-conductor 132n through a terminal via-connector VD.

Figure 2A:
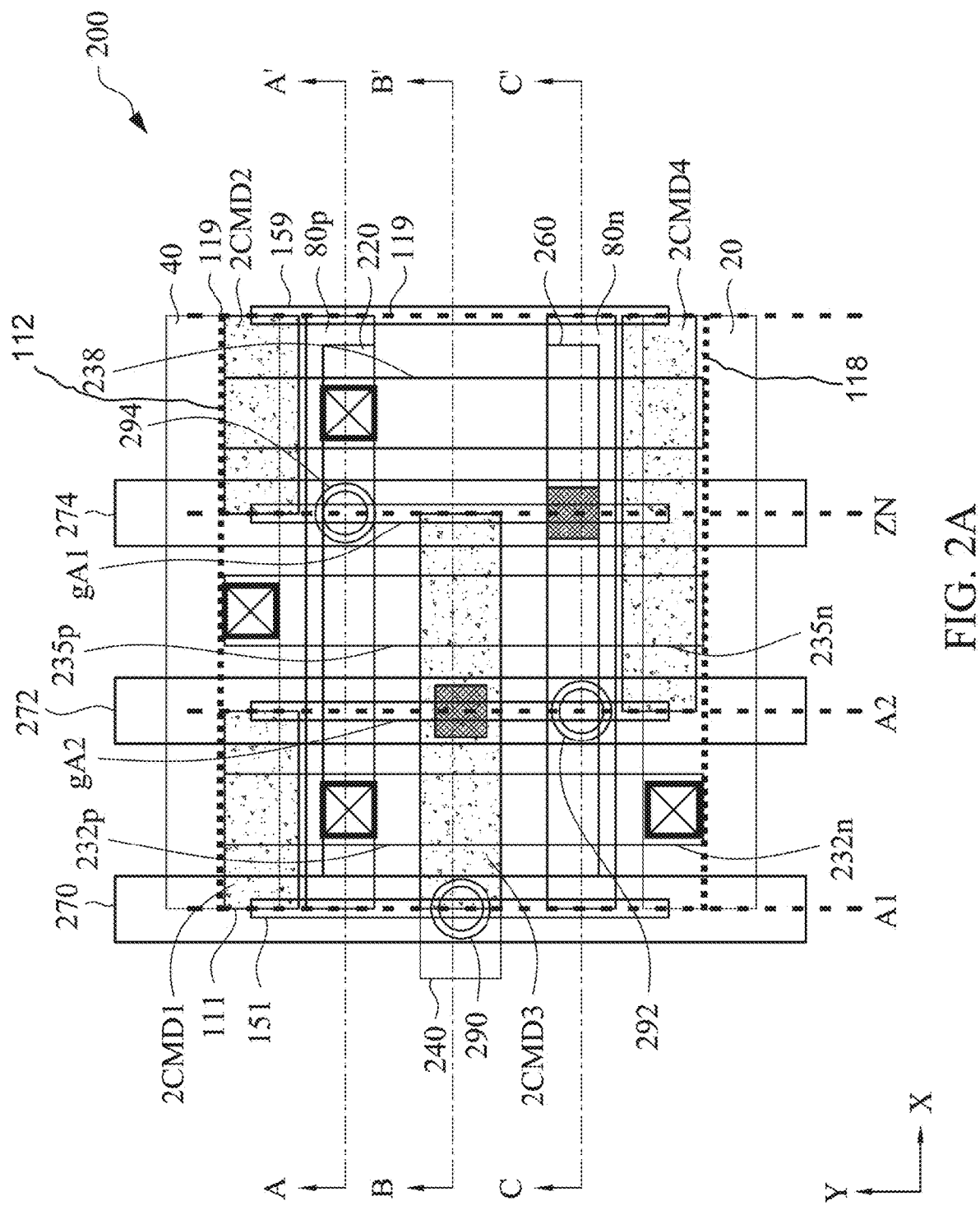
FIG. 2A is a layout diagram of a NAND circuit, in accordance with some embodiments.

FIG. 2A is a layout diagram of a NAND circuit 200, in accordance with some embodiments. The layout diagram of FIG. 2A includes the layout patterns for specifying a p-type active zone 80p and an n-type active zone 80n both extending in the X-direction, gate-conductors (gA2 and gA1) extending in the Y-direction, terminal-conductors (232p, 232n, 235p, 235n, and 238) extending in the Y-direction, and dummy gate-conductors (151 and 159) extending in the Y-direction. The layout diagram of FIG. 2A also includes the layout patterns for specifying power rails (40 and 20) extending in the X-direction, horizontal conducting lines (220, 240, and 260) extending in the X-direction, vertical conducting lines (270, 272, and 274) extending in the Y-direction, and various via-connectors. The NAND circuit 200 is in a cell that is bounded by four cell boundaries. The cell width along the X-direction is bounded by two vertical cell boundaries 111 and 119 extending in the Y-direction. The cell height extending in the Y-direction is bounded by two horizontal cell boundaries 112 and 118 extending in the X-direction.

Figure 2B:
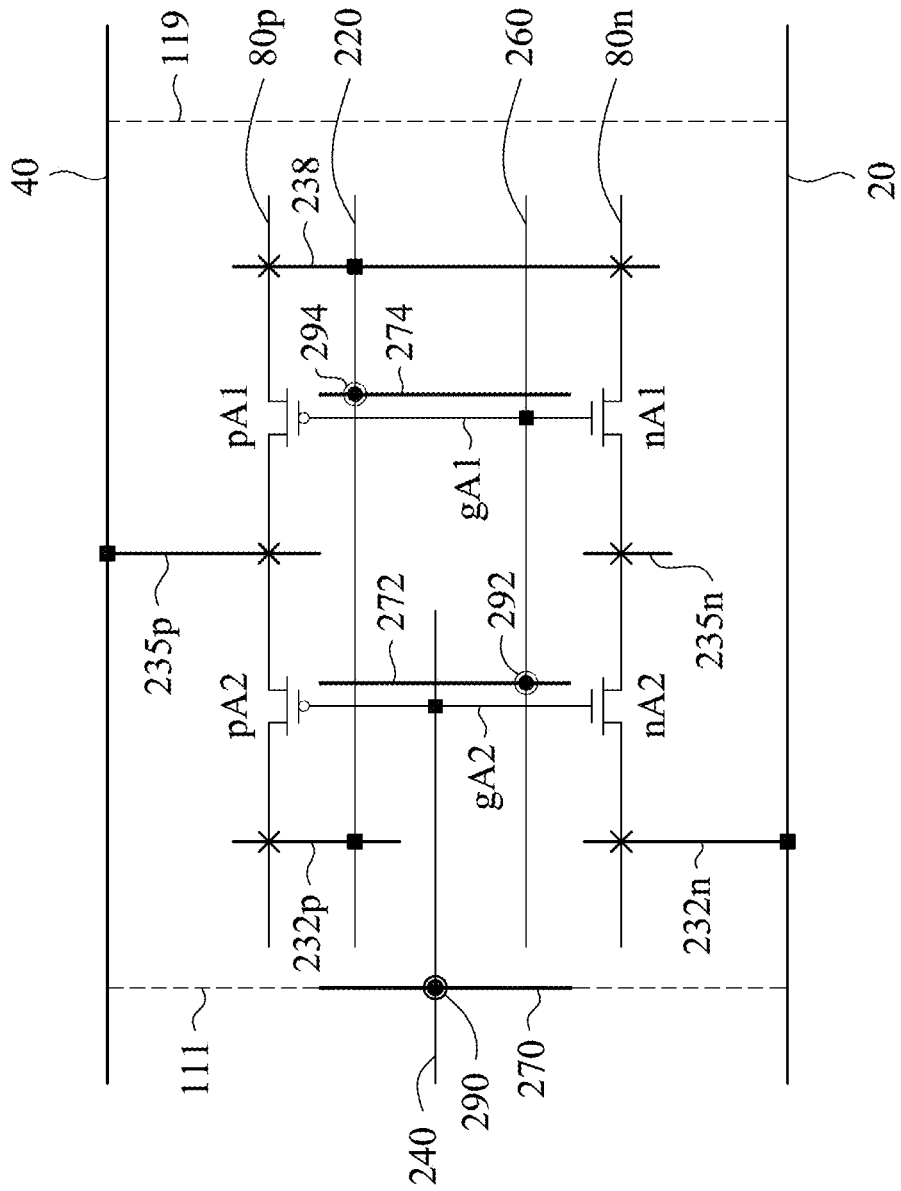
FIG. 2B is an equivalent circuit of the NAND circuit as specified by the layout diagram in FIG. 2A, in accordance with some embodiments.
Figure 2C:
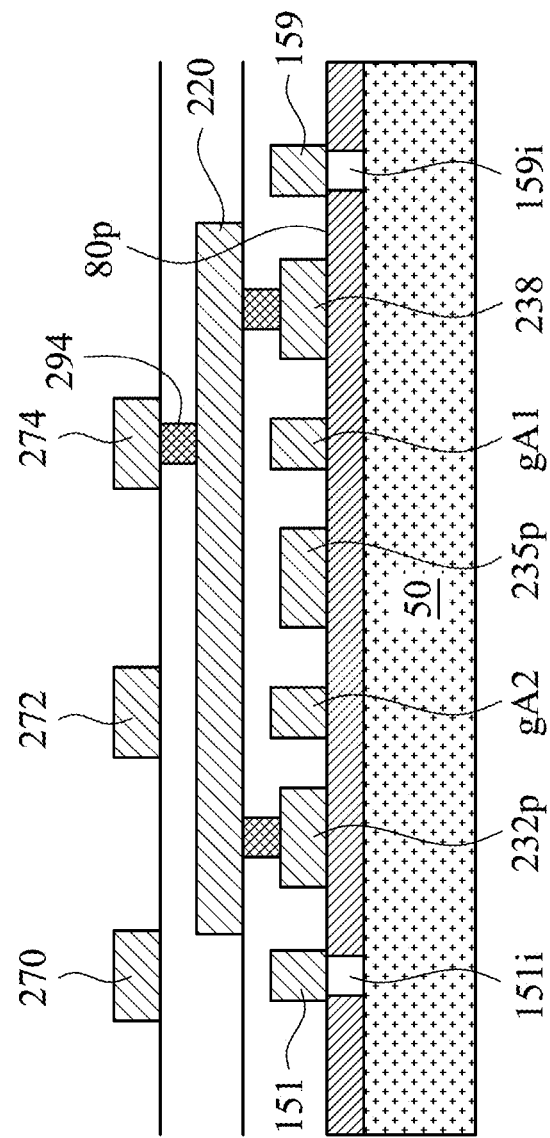
FIGS. 2C-2E are cross-sectional views of the NAND circuit as specified by the layout diagram in FIG. 2A, in accordance with some embodiments.
Figure 2D:
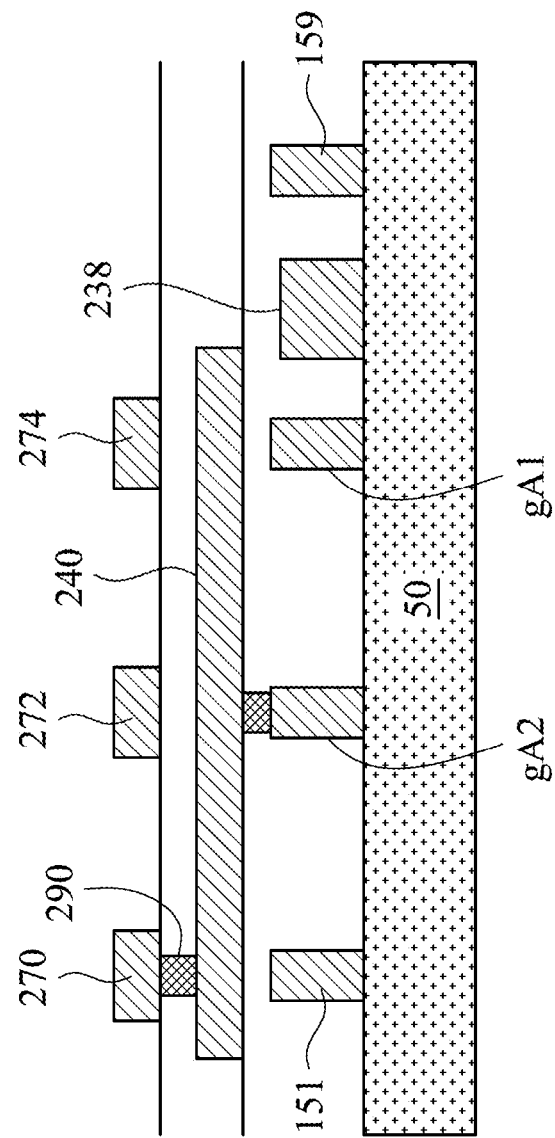
Figure 2E:
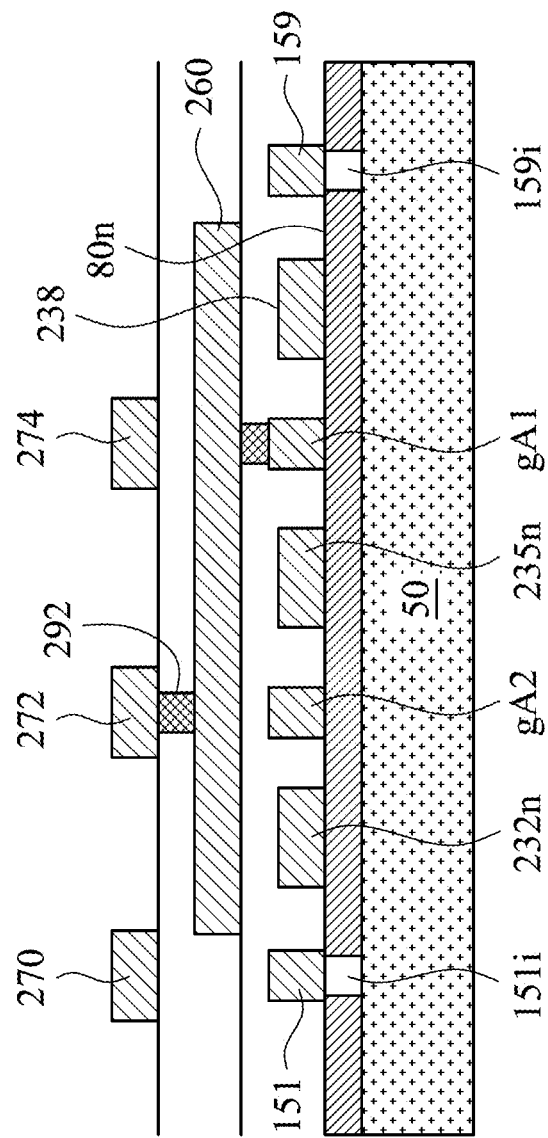

FIG. 2B is an equivalent circuit of the NAND circuit 200 as specified by the layout diagram in FIG. 2A, in accordance with some embodiments. FIGS. 2C-2E are cross-sectional views of the NAND circuit 200 as specified by the layout diagram in FIG. 2A, in accordance with some embodiments.

In the NAND circuit 200 as specified by the layout diagram of FIG. 2A and as shown in the equivalent circuit of FIG. 2B, the gate-conductor gA2 intersects the semiconductor structures in the p-type active zone 80p at the channel region of a p-type transistor pA2, and intersects the n-type active zone 80n at the channel region of an n-type transistor nA2. The gate-conductor gA1 intersects the semiconductor structures in the p-type active zone 80p at the channel region of a p-type transistor pA1, and intersects the n-type active zone 80n at the channel region of an n-type transistor nA1. The terminal-conductors 232p and 235p intersect the semiconductor structure in the p-type active zone 80p at various source/drain regions of the p-type transistor pA2 and pA1. The terminal-conductors 232n and 235n intersect the semiconductor structure in the n-type active zone 80n at various source/drain regions of the n-type transistor nA2 and nA1. The terminal-conductor 238 intersects the semiconductor structures in the p-type active zone 80p at the drain region of the p-type transistor pA1, and intersects the n-type active zone 80n at the drain region of the n-type transistor nA1. Non-limiting examples of the p-type transistors (pA2 and pA1) and the n-type transistors (nA2 and nA1) include FinFETs, nano-sheet transistors, and nano-wire transistors. The layout patterns for the dummy gate-conductors 151 and 159 in FIG. 2A specify that the active regions (such as, source regions, drain regions, and channel regions) in the NAND circuit 200 are isolated from the active regions in adjacent cells.

In the NAND circuit 200 as specified by the layout diagram of FIG. 2A and as shown in the equivalent circuit of FIG. 2B, the horizontal conducting lines (220, 240, and 260) and the power rails (40 and 20) are positioned in a first connection layer M0. The terminal-conductor 235p is conductively connected to the power rail 40, which is configured for providing a first supply voltage VDD. The terminal-conductor 232n is conductively connected to the power rail 20, which is configured for providing a second supply voltage VSS. Each of the horizontal conducting line 240 and the horizontal conducting line 260 is correspondingly connected to one of the gate-conductor gA2 and the gate-conductor gA1 through a gate via-connector VG. The horizontal conducting line 220 is conductively connected to each of the terminal-conductors 232p and 238 through a via-connector VD.

In the NAND circuit 200 as specified by the layout diagram of FIG. 2A and as shown in the equivalent circuit of FIG. 2B, the vertical conducting lines (270, 272, and 274) are in the second connection layer M1 which is above the first connection layer M0 (as shown in FIGS. 2C-2E), and each of the vertical conducting lines (270, 272, and 274) overlaps with the circuit cell containing the NAND circuit 200. Specifically, in a plan view, at least a part of the area occupied by each of the vertical conducting lines (270, 272, and 274) is between vertical cell boundaries 111 and 119, and each of the vertical conducting lines (270, 272, and 274) also extends across the two horizontal cell boundaries 112 and 118. Each of the vertical conducting lines 270, 272, and 274 is correspondingly connected to one of the horizontal conducting lines 240, 260, and 220 though one of the via-connectors 290, 292, and 294. Each of the via-connectors 290, 292, and 294 is a via-connector VIA0 that passes through the ILD materials separating the second connection layer M1 and the first connection layer M0. Each of the vertical conducting lines 272 and 274 is atop one of the gate-conductors gA2 and gA1, while the vertical conducting line 270 is atop the dummy gate-conductor 151. Each of the via-connectors 290, 292, and 294 functions as a pin-connector. The vertical conducting line 270, the via-connector 290, and the horizontal conducting line 240 are conductively connected together to carry an input signal "A2" of the NAND circuit 200. The vertical conducting line 272, the via-connector 292, and the horizontal conducting line 260 are conductively connected together to carry an input signal "A1" of the NAND circuit 200. The vertical conducting line 274, the via-connector 294, and the horizontal conducting line 220 are conductively connected together to carry an output signal "ZN" of the NAND circuit 200.

In the layout diagram of FIG. 2A, the layout pattern 2CMD1 specifies that, in the first connection layer M0, the terminal-conductor 232p is not directly connected to the power rail 40. The layout pattern 2CMD2 specifies that, in the first connection layer M0, the terminal-conductor 238 is not directly connected to the power rail 40. The layout pattern 2CMD4 specifies that, in the first connection layer M0, the terminal-conductor 235n and 238 is not directly connected to the power rail 20. The layout pattern 2CMD3 specifies that, in the first connection layer M0, the terminal-conductors 232p and 232n are not directly connected together, and the terminal-conductors 235p and 235n are not directly connected together.

FIG. 2C is a cross-sectional view of the NAND circuit 200 as specified by FIG. 2A in a cutting plane A-A', in accordance with some embodiments. As shown in FIG. 2C, the semiconductor structure in the p-type active zone 80p is on the substrate 50. Each of the terminal-conductors 232p, 235p, and 238 intersects the semiconductor structure in the p-type active zone 80p. Each of the gate-conductors gA2 and gA1 also intersects the semiconductor structure in the p-type active zone 80p. In some embodiments, the active regions (such as, the source region, the channel region, or the drain region) in the p-type active zone 80p are isolated from the active regions in the adjacent cells, by the boundary isolation region 151i under the dummy gate-conductor 151 and the boundary isolation region 159i under the dummy gate-conductor 159. The vertical conducting line 274 is conductively connected to the horizontal conducting line 220 though the via-connector 294. The horizontal conducting line 220 is conductively connected to each of the terminal-conductors 232p and 238 through a corresponding via-connector VD.

FIG. 2D is a cross-sectional view of the NAND circuit 200 as specified by FIG. 2A in a cutting plane B-B', in accordance with some embodiments. As shown in FIG. 2D, the vertical conducting line 270 is conductively connected to the horizontal conducting line 240 though the via-connector 290. The horizontal conducting line 240 is conductively connected to the gate-conductor gA2 through the via-connector VG. The horizontal conducting line 240 extends in the negative X-direction and crosses over the dummy gate-conductor 151.

FIG. 2E is a cross-sectional view of the NAND circuit 200 as specified by FIG. 2A in a cutting plane C-C', in accordance with some embodiments. As shown in FIG. 2E, the semiconductor structure in the n-type active zone 80n is on the substrate 50. Each of the terminal-conductors 232n, 235n, and 238 intersects the semiconductor structure in the n-type active zone 80n. Each of the gate-conductors gA2 and gA1 also intersects the semiconductor structure in the n-type active zone 80n. In some embodiments, the active regions (such as, the source region, the channel region, or the drain region) in the n-type active zone 80n are isolated from the active regions in the adjacent cells, by the boundary isolation region 151i under the dummy gate-conductor 151 and the boundary isolation region 159i under the dummy gate-conductor 159. The vertical conducting line 272 is conductively connected to the horizontal conducting line 260 though the via-connector 292. The horizontal conducting line 260 is conductively connected to the gate-conductor gA1 through a via-connector VG.

Figure 3A:
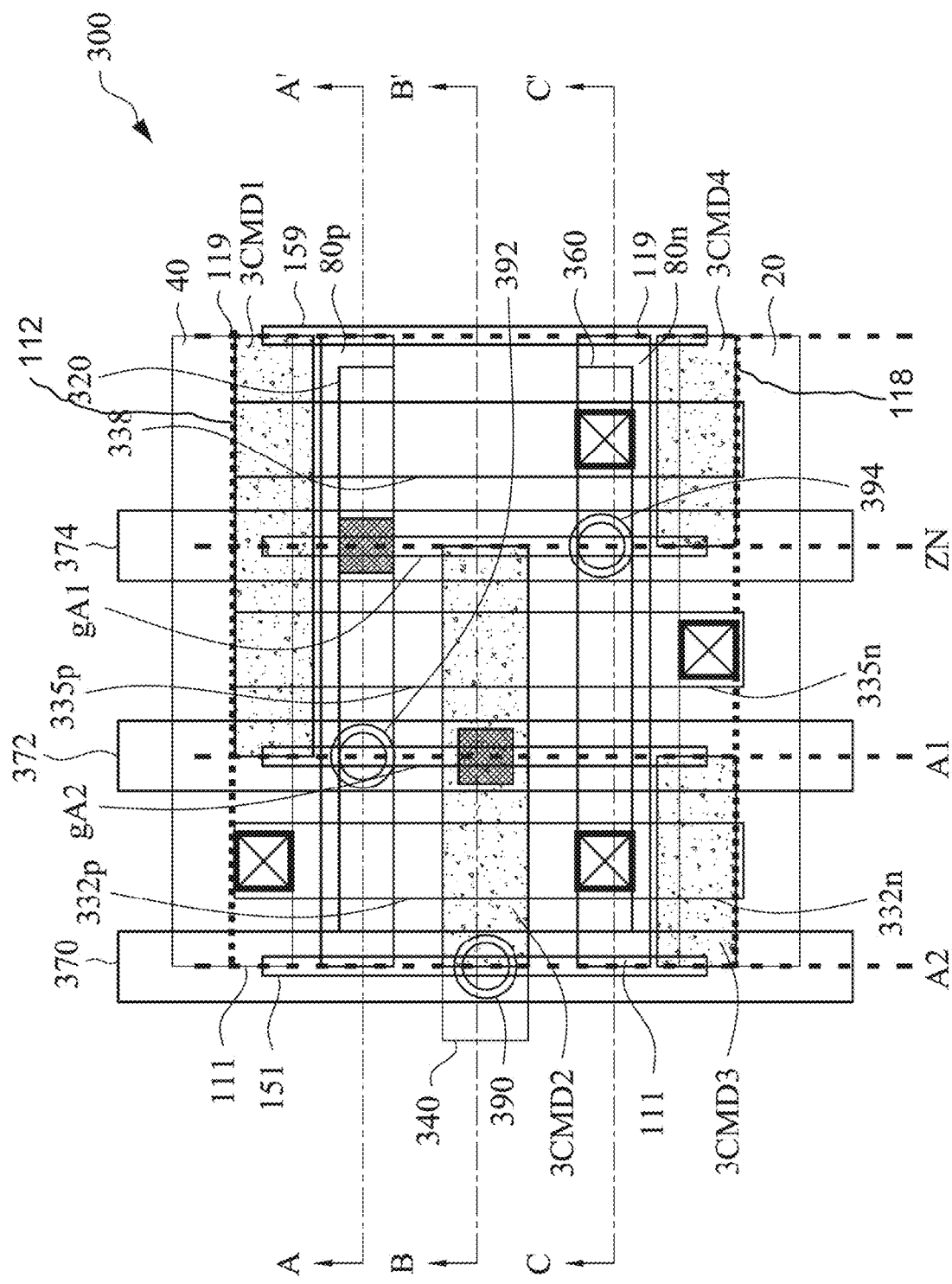
FIG. 3A is a layout diagram of a NOR circuit, in accordance with some embodiments.

FIG. 3A is a layout diagram of an NOR circuit 300, in accordance with some embodiments. The layout diagram of FIG. 3A includes the layout patterns for specifying a p-type active zone 80*p* and an n-type active zone 80*n* both extending in the X-direction, gate-conductors (gA2 and gA1) extending in the Y-direction, terminal-conductors (332*p*, 332*n*, 335*p*, 335*n*, and 338) extending in the Y-direction, and dummy gate-conductors (151 and 159) extending in the Y-direction. The layout diagram of FIG. 3A also includes the layout patterns for specifying the power rails (40 and 20) extending in the X-direction, horizontal conducting lines (320, 340, and 360) extending in the X-direction, vertical conducting lines (370, 372, and 374) extending in the Y-direction, and various via-connectors. The NOR circuit 300 is in a cell that is bounded by four cell boundaries. The cell width along the X-direction is bounded by two vertical cell boundaries 111 and 119 extending in the Y-direction. The cell height extending in the Y-direction is bounded by two horizontal cell boundaries 112 and 118 extending in the X-direction.

Figure 3B:
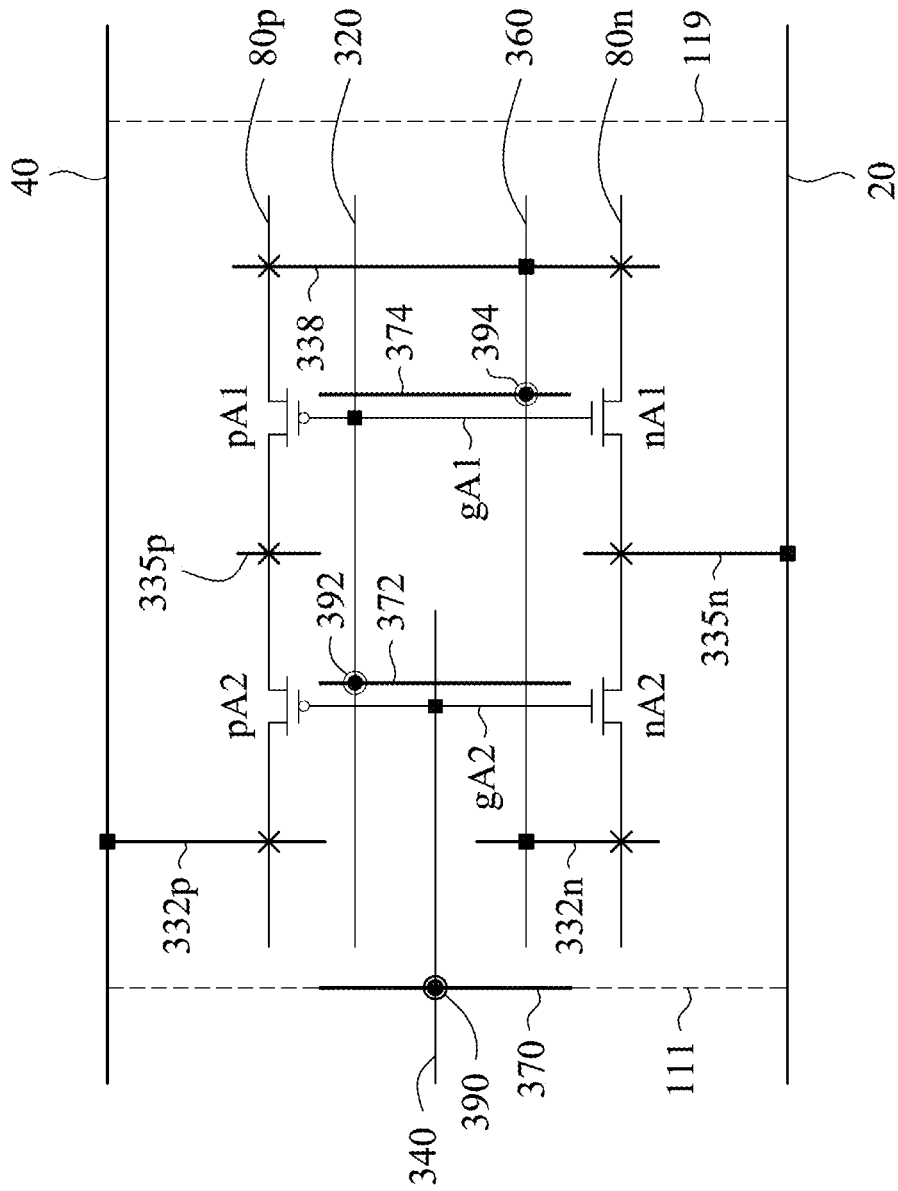
FIG. 3B is an equivalent circuit of the NOR circuit as specified by the layout diagram in FIG. 3A, in accordance with some embodiments.
Figure 3C:
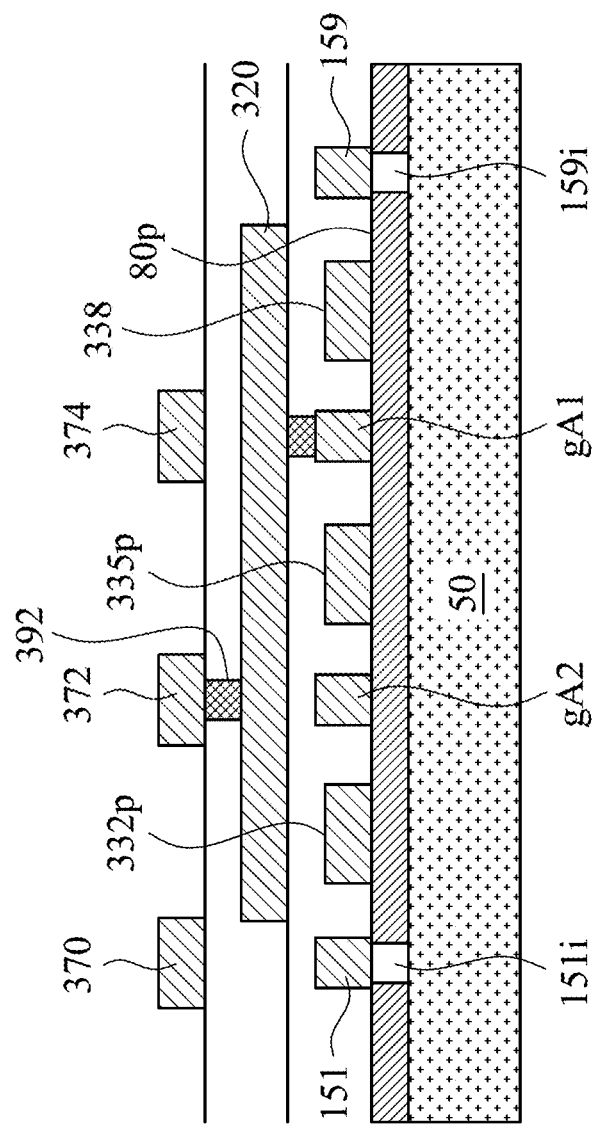
FIGS. 3C-3E are cross-sectional views of the NOR circuit as specified by the layout diagram in FIG. 3A, in accordance with some embodiments.
Figure 3D:
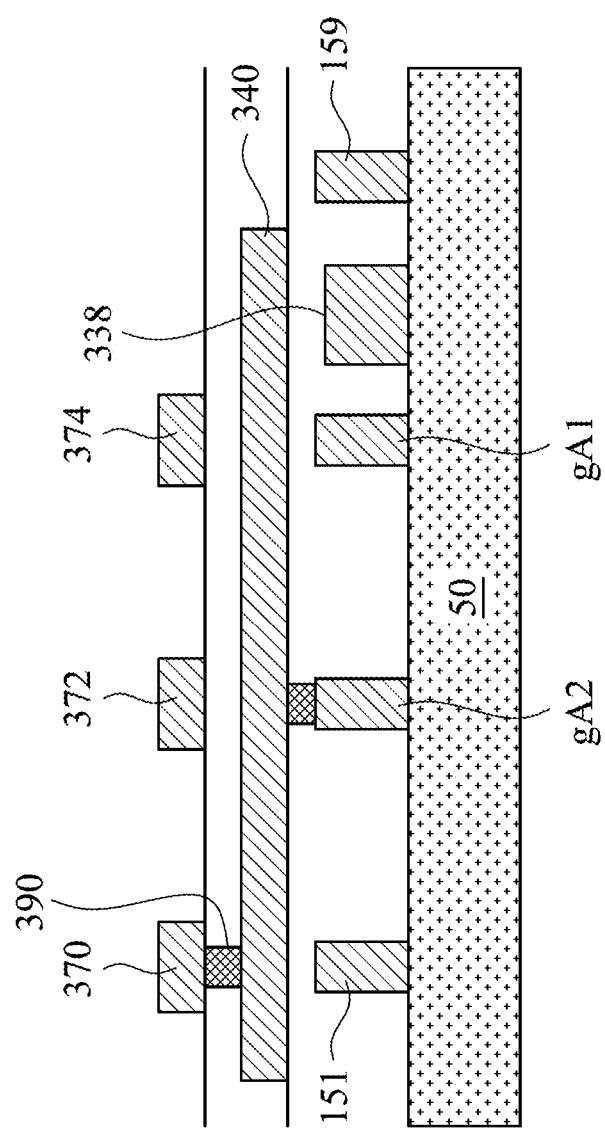
Figure 3E:
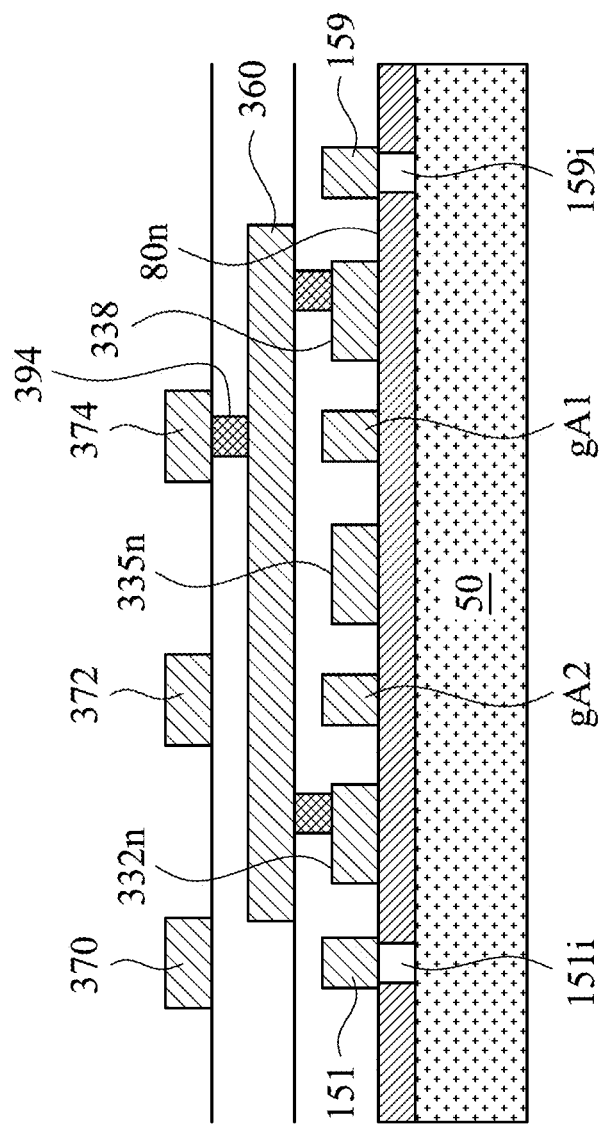

FIG. 3B is an equivalent circuit of the NOR circuit 300 as specified by the layout diagram in FIG. 3A, in accordance with some embodiments. FIGS. 3C-3E are cross-sectional views of the NOR circuit 300 as specified by the layout diagram in FIG. 3A, in accordance with some embodiments.

In the NOR circuit 300 as specified by the layout diagram of FIG. 3A and as shown in the equivalent circuit of FIG. 3B, the gate-conductor gA2 intersects the semiconductor structures in the p-type active zone 80*p* at the channel region of a p-type transistor pA2, and intersects the n-type active zone 80*n* at the channel region of an n-type transistor nA2. The gate-conductor gA1 intersects the semiconductor structures in the p-type active zone 80*p* at the channel region of a p-type transistor pA1, and intersects the n-type active zone 80*n* at the channel region of an n-type transistor nA1. The terminal-conductors 332*p* and 335*p* intersect the semiconductor structure in the p-type active zone 80*p* at various source/drain regions of the p-type transistor pA2 and pA1. The terminal-conductors 332*n* and 335*n* intersect the semiconductor structure in the n-type active zone 80*n* at various source/drain regions of the n-type transistor nA2 and nA1. The terminal-conductor 338 intersect the semiconductor structures in the p-type active zone 80*p* and the n-type active zone 80*n* correspondingly at the drain region of the p-type transistor pA1 and at the drain region of the n-type transistor nA1. Non-limiting examples of the p-type transistors (pA2 and pA1) and the n-type transistors (nA2 and nA1) include FinFETs, nano-sheet transistors, and nano-wire transistors. The layout patterns for the dummy gate-conductors 151 and 159 in FIG. 3A specify that the active regions (such as, source regions, drain regions, and channel regions) in the NOR circuit 300 are isolated from the active regions in adjacent cells.

In the NOR circuit 300 as specified by the layout diagram of FIG. 3A and as shown in the equivalent circuit of FIG. 3B, the horizontal conducting lines (320, 340, and 360) and the power rails (40 and 20) are positioned in a first connection layer M0. The terminal-conductor 332*p* is conductively connected to the power rail 40, which is configured for providing a first supply voltage VDD. The terminal-conductor 335*n* is conductively connected to the power rail 20, which is configured for providing a second supply voltage VSS. Each of the horizontal conducting line 340 and the horizontal conducting line 320 is correspondingly connected to one of the gate-conductor gA2 and the gate-conductor gA1 through a gate via-connector VG. The horizontal conducting line 360 is conductively connected to each of the terminal-conductors 332*n* and 338 through a via-connector VD.

In the NOR circuit 300 as specified by the layout diagram of FIG. 3A and as shown in the equivalent circuit of FIG. 3B, the vertical conducting lines (370, 372, and 374) are in the second connection layer M1 which is above the first connection layer M0 (as shown in FIGS. 3C-3E), and each of the vertical conducting lines overlaps with the circuit cell containing the NOR circuit 300. Each of the vertical conducting lines 370, 372, and 374 is correspondingly connected to one of the horizontal conducting lines 340, 320, and 360 though one of the via-connectors 390, 392, and 394. Each of the via-connectors 390, 392, and 394 is a via-connector VIA0 that passes through the ILD materials separating the second connection layer M1 and the first connection layer M0. Each of the vertical conducting lines 372 and 374 is atop one of the gate-conductors gA2 and gA1, while the vertical conducting line 370 is atop the dummy gate-conductor 151. Each of the via-connectors 390, 392, and 394 functions as a pin-connector. The vertical conducting line 370, the via-connector 390, and the horizontal conducting line 340 are conductively connected together to carry an input signal "A2" of the NOR circuit 300. The vertical conducting line 372, the via-connector 392, and the horizontal conducting line 320 are conductively connected together to carry an input signal "A1" of the NOR circuit 300. The vertical conducting line 374, the via-connector 394, and the horizontal conducting line 360 are conductively connected together to carry an output signal "ZN" of the NOR circuit 300.

In the layout diagram of FIG. 3A, the layout pattern 3CMD1 specifies that, in the first connection layer M0, the terminal-conductor 335*p* and 338 are not directly connected to the power rail 40. The layout pattern 3CMD2 specifies that, in the first connection layer M0, the terminal-conductor 332*p* and 332*n* are not directly connected together, and the terminal-conductor 335*p* and 335*n* are not directly connected together. In the layout diagram of FIG. 3A, the layout pattern 3CMD3 specifies that, in the first connection layer M0, the terminal-conductor 332*n* is not directly connected to the power rail 20. The layout pattern 3CMD4 specifies that, in the first connection layer M0, the terminal-conductor 338 is not directly connected to the power rail 20.

FIG. 3C is a cross-sectional view of the NOR circuit 300 as specified by FIG. 3A in a cutting plane A-A', in accordance with some embodiments. As shown in FIG. 3C, the semiconductor structure in the p-type active zone 80*p* is on the substrate 50. Each of the terminal-conductors 332*p*, 355*p*, and 338 intersects the semiconductor structure in the p-type active zone 80*p*. Each of the gate-conductors gA2 and gA1 also intersects the semiconductor structure in the p-type active zone 80*p*. In some embodiments, the active regions (such as, the source region, the channel region, or the drain region) in the p-type active zone 80*p* are isolated from the active regions in the adjacent cells, by the boundary isolation region 151*i* under the dummy gate-conductor 151 and the boundary isolation region 159*i* under the dummy gate-conductor 159. The vertical conducting line 372 is conductively connected to the horizontal conducting line 320 though the via-connector 392. The horizontal conducting line 320 is conductively connected to the gate-conductor gA1 through a via-connector VG.

FIG. 3D is a cross-sectional view of the NOR circuit 300 as specified by FIG. 3A in a cutting plane B-B', in accordance with some embodiments. As shown in FIG. 3D, the vertical conducting line 370 is conductively connected to the horizontal conducting line 340 though the via-connector 390. The horizontal conducting line 340 is conductively connected to the gate-conductor gA2 through the via-connector VG. The horizontal conducting line 340 crosses over the dummy gate-conductor 151 while extending in the negative X-direction.

FIG. 3E is a cross-sectional view of the NOR circuit 300 as specified by FIG. 3A in a cutting plane C-C', in accordance with some embodiments. As shown in FIG. 3E, the semiconductor structure in the n-type active zone 80n is on the substrate 50. Each of the terminal-conductors 332n, 355n, and 338 intersects the semiconductor structure in the n-type active zone 80n. Each of the gate-conductors gA2 and gA1 also intersects the semiconductor structure in the n-type active zone 80n. In some embodiments, the active regions (such as, the source region, the channel region, or the drain region) in the p-type active zone 80p are isolated from the active regions in the adjacent cells, by the boundary isolation region 151i under the dummy gate-conductor 151 and the boundary isolation region 159i under the dummy gate-conductor 159. The vertical conducting line 374 is conductively connected to the horizontal conducting line 360 though the via-connector 394. The horizontal conducting line 360 is conductively connected to each of the terminal-conductors 332n and 338 through a corresponding via-connector VD.

Figure 4A:
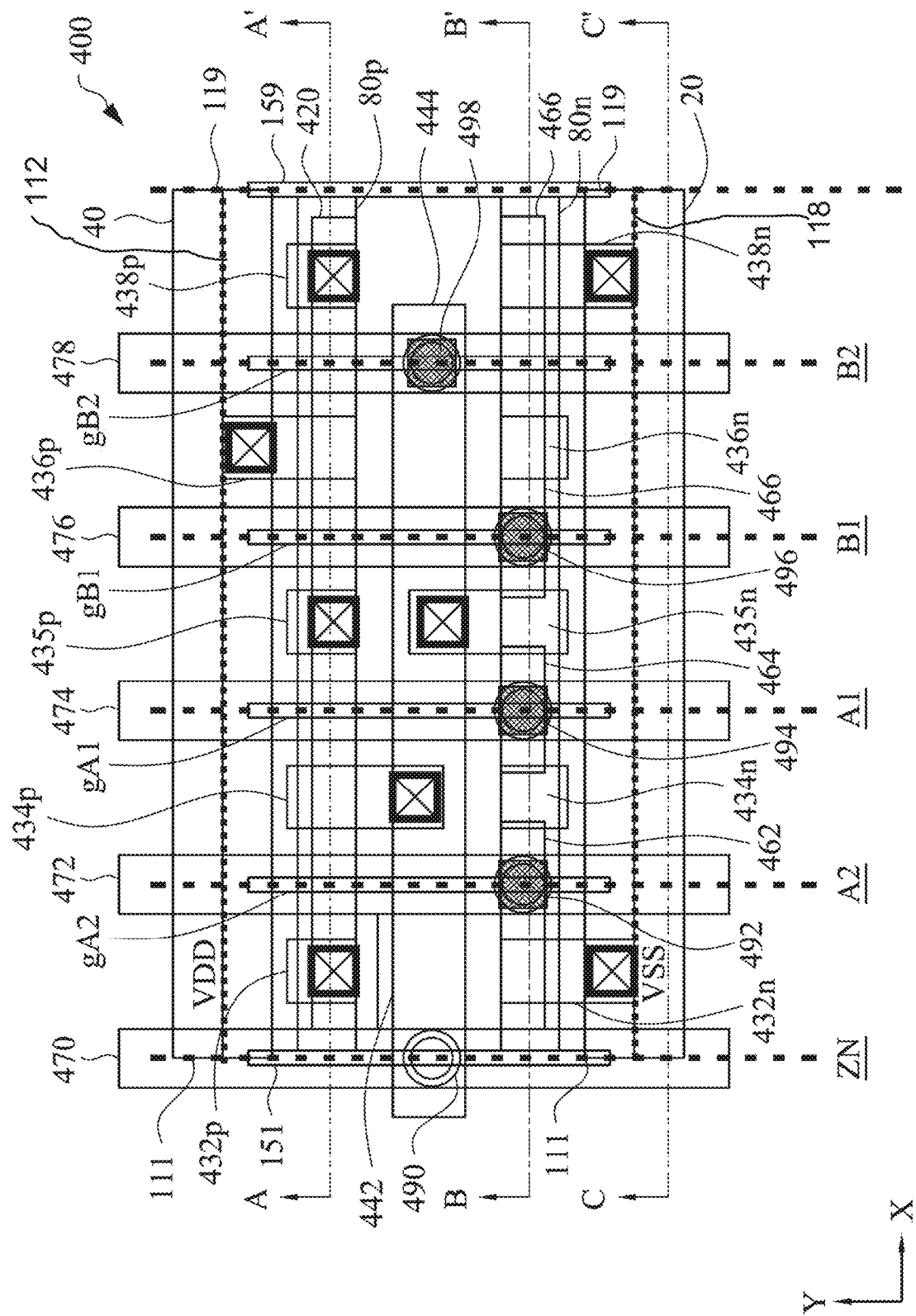
FIG. 4A is a layout diagram of an AOI circuit, in accordance with some embodiments.

FIG. 4A is a layout diagram of an And-Or-Invertor circuit ("AOI circuit 400"), in accordance with some embodiments. The layout diagram of FIG. 4A includes the layout patterns for specifying a p-type active zone 80p and an n-type active zone 80n both extending in the X-direction, gate-conductors (gA2, gA1, gB1, and gB2) extending in the Y-direction, terminal-conductors (432p, 432n, 434p, 434n, 435p, 435n, 436p, 436n, 438p, 438n) extending in the Y-direction, and dummy gate-conductors (151 and 159) extending in the Y-direction. The layout diagram of FIG. 4A also includes the layout patterns for specifying power rails (40 and 20) extending in the X-direction, horizontal conducting lines (420, 442, 444, 462, 464, and 466) extending in the X-direction, vertical conducting lines (470, 472, 474, 476, and 478) extending in the Y-direction, and various via-connectors. The AOI circuit 400 is in a cell that is bounded by four cell boundaries. The cell width along the X-direction is bounded by two vertical cell boundaries 111 and 119 extending in the Y-direction. The cell height extending in the Y-direction is bounded by two horizontal cell boundaries 112 and 118 extending in the X-direction.

Figure 4B:
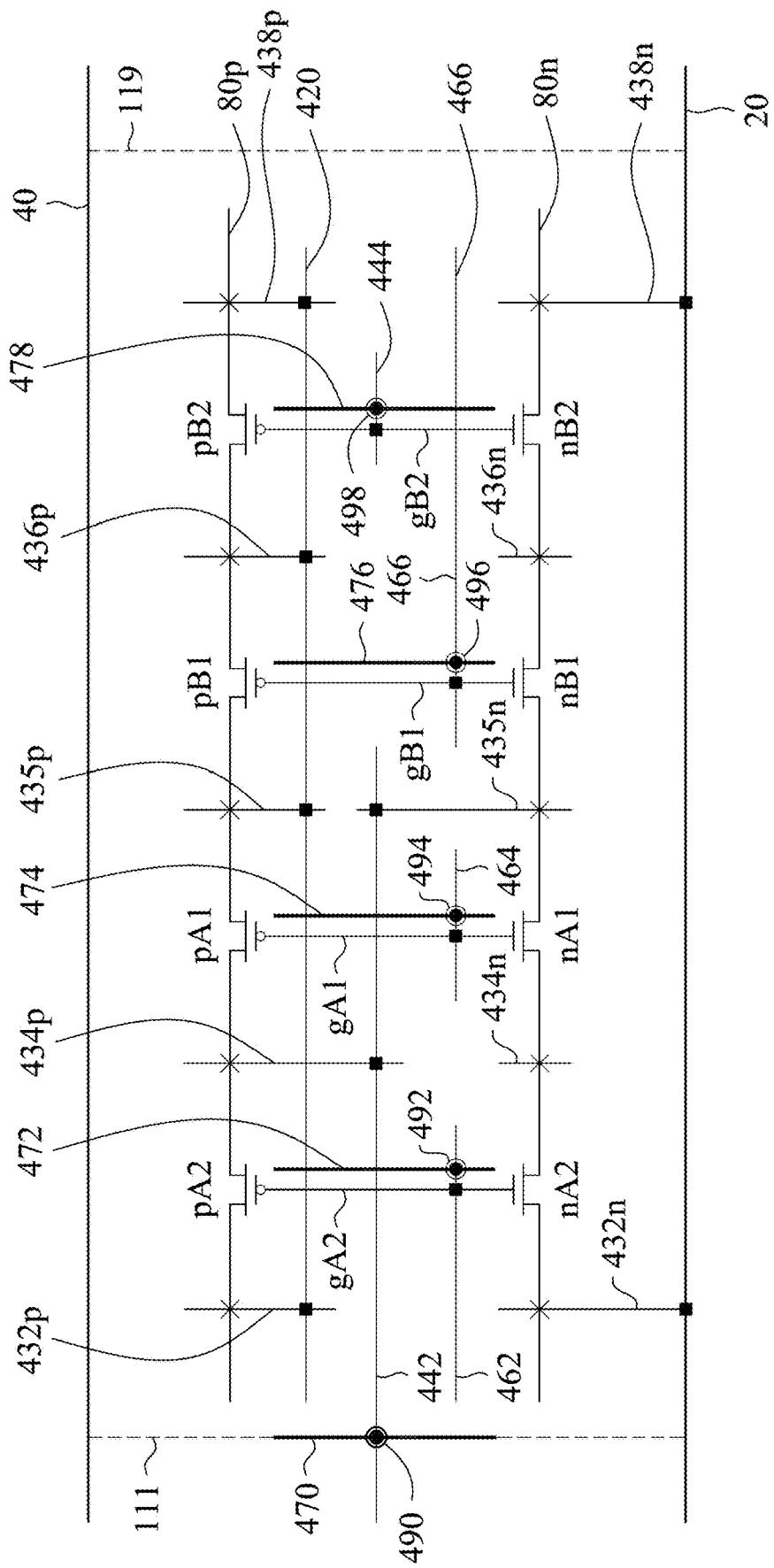
FIG. 4B is an equivalent circuit of the AOI circuit as specified by the layout diagram in FIG. 4A, in accordance with some embodiments.
Figure 4C:
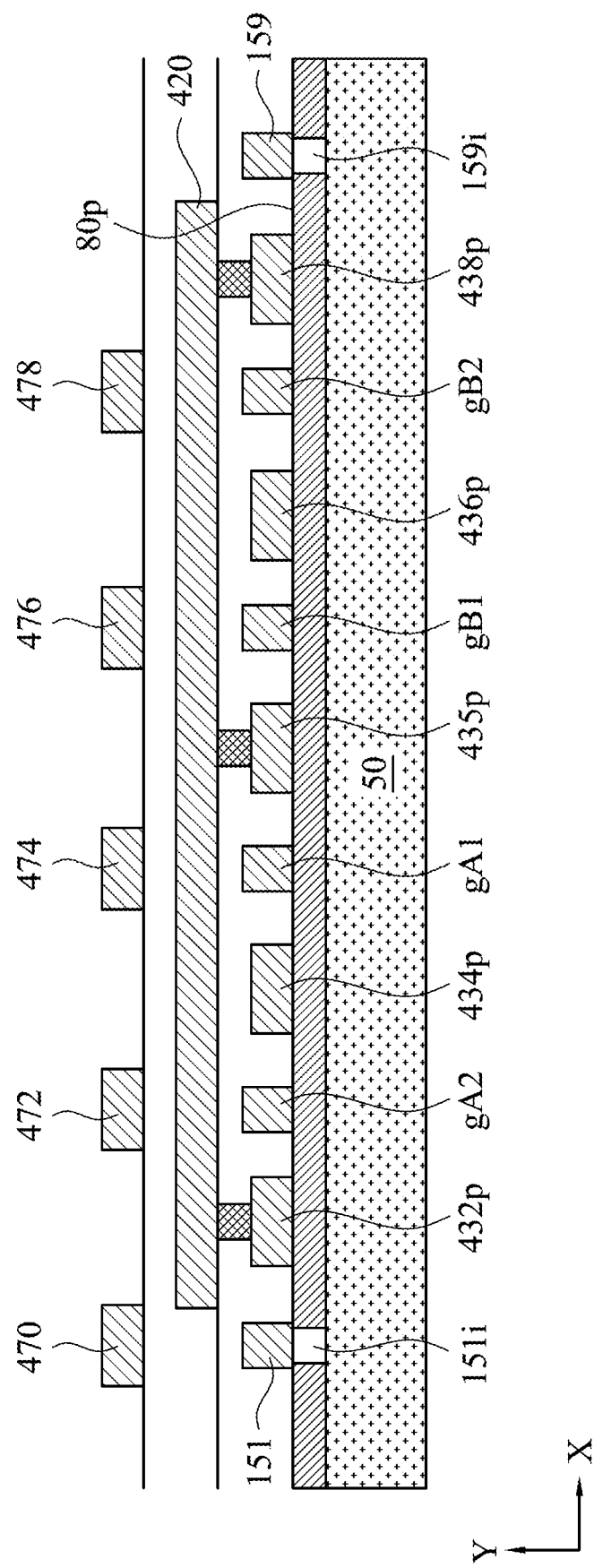
FIGS. 4C-4E are cross-sectional views of AOI circuit as specified by the layout diagram in FIG. 4A, in accordance with some embodiments.
Figure 4D:
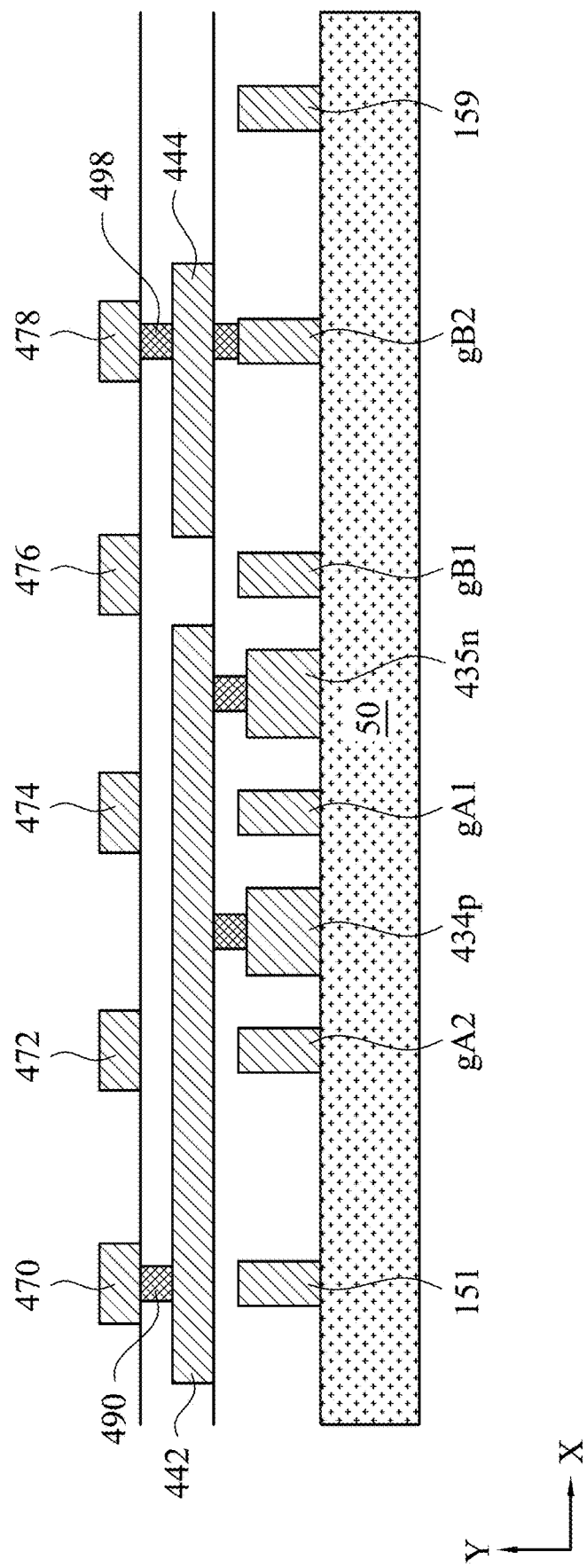
Figure 4E:
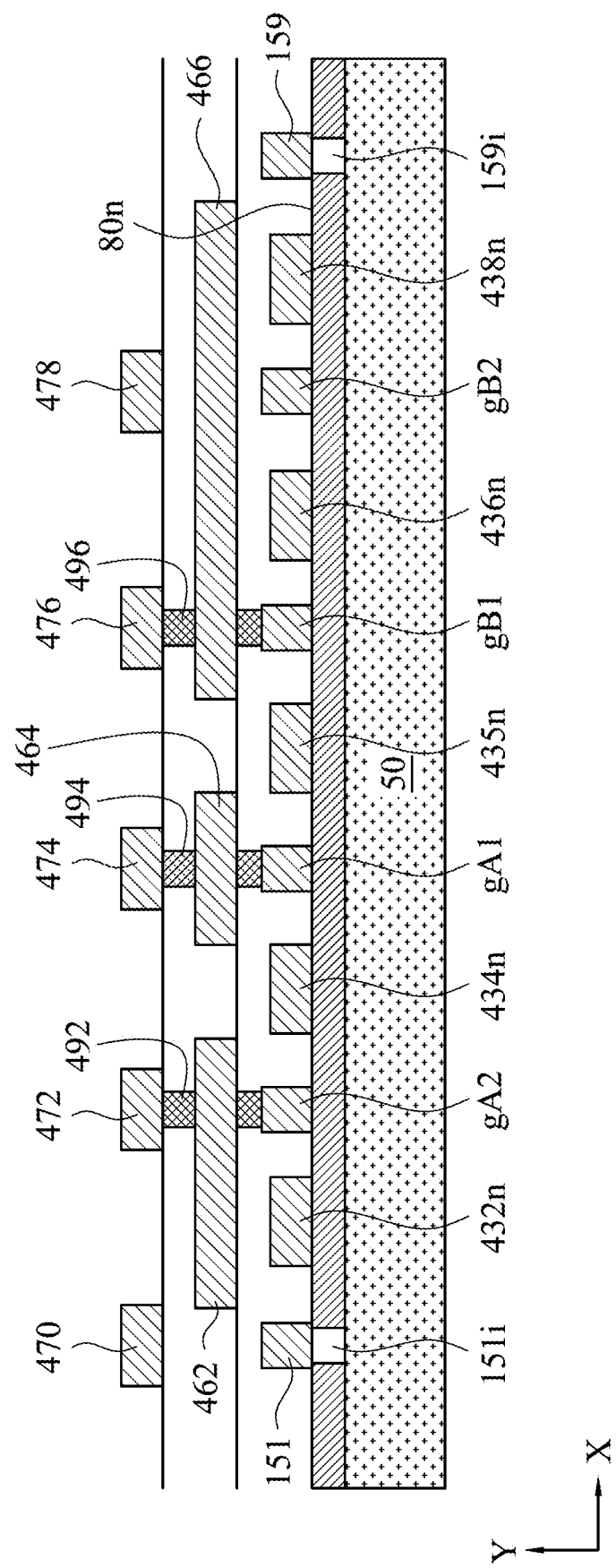

FIG. 4B is an equivalent circuit of the AOI circuit 400 as specified by the layout diagram in FIG. 4A, in accordance with some embodiments. FIGS. 4C-4E are cross-sectional views of AOI circuit 400 as specified by the layout diagram in FIG. 4A, in accordance with some embodiments.

In the AOI circuit 400 as specified by the layout diagram of FIG. 4A and as shown in the equivalent circuit of FIG. 4B, each of the gate-conductors gA2, gA1, gB1, and gB2 intersects the semiconductor structure in the p-type active zone 80p and forms correspondingly the gate terminal for each of the p-type transistors pA2, pA1, pB1, and pB2. Each of the gate-conductors gA2, gA1, gB1, and gB2 also intersects the semiconductor structure in the n-type active zone 80n and forms correspondingly the gate terminal for each of the n-type transistors nA2, nA1, nB1, and nB2. Each of the terminal-conductors 432p, 434p, 435p, 436p, and 438p intersects the semiconductor structure in the p-type active zone 80p and forms various source/drain terminals for the p-type transistors pA2, pA1, pB1, and pB2. Each of the terminal-conductors 432n, 434n, 435n, 436n, and 438n intersects the semiconductor structure in the n-type active zone 80n and forms various source/drain terminals for the n-type transistors nA2, nA1, nB1, and nB2. Non-limiting examples of the p-type transistors and the n-type transistors include FinFETs, nano-sheet transistors, and nano-wire transistors. The layout patterns for the dummy gate-conductors 151 and 159 in FIG. 4A specify that the active regions (such as, source regions, drain regions, and channel regions) in the AOI circuit 400 are isolated from the active regions in adjacent cells.

In the AOI circuit 400 as specified by the layout diagram of FIG. 4A and as shown in the equivalent circuit of FIG. 4B, the horizontal conducting lines (420, 442, 444, 462, 464, and 466) and the power rails (40 and 20) are positioned in a first connection layer M0. The terminal-conductor 436p is conductively connected to the power rail 40, which is configured for providing a first supply voltage VDD. Each of the terminal-conductors 432n and 438n is conductively connected to the power rail 20, which is configured for providing a second supply voltage VSS. Each of the horizontal conducting lines 462, 464, 466 and 444 is correspondingly connected to one of the gate-conductors gA2, gA1, gB1, and gB2 through a gate via-connector VG. The horizontal conducting line 442 is conductively connected to each of the terminal-conductors 434p and 435n through a via-connector VD. The horizontal conducting line 420 is conductively connected to each of the terminal-conductors 432p 435p, and 438p through a via-connector VD.

In the AOI circuit 400 as specified by the layout diagram of FIG. 4A and as shown in the equivalent circuit of FIG. 4B, the vertical conducting lines (470, 472, 474, 476, and 478) are in the second connection layer M1 which is above the first connection layer M0 (as shown in FIGS. 4C-4E), and each of the vertical conducting lines overlaps with the circuit cell containing the AOI circuit 400. Each of the vertical conducting lines 470, 472, 474, 476, and 478 is correspondingly connected to one of the horizontal conducting lines 442, 462, 464, 466 and 444 though one of the via-connectors 490, 492, 494, 496, and 498. Each of the via-connectors 490, 492, 494, 496, and 498 is a via-connector VIA0 that passes through the ILD materials separating the second connection layer M1 and the first connection layer M0. Each of the vertical conducting lines 472, 474, 476, and 478 is correspondingly atop one of the gate-conductors gA2, gA1, gB1, and gB2, while the vertical conducting line 470 is atop the dummy gate-conductor 151.

Each of the via-connectors 490, 492, 494, 496, and 498 functions as a pin-connector. The vertical conducting line 470, the via-connector 490, and the horizontal conducting line 442 are conductively connected together to carry an output signal "ZN" of the AOI circuit 400. The vertical conducting line 470, the via-connector 490, and the horizontal conducting line 442 are conductively connected together to carry an output signal "ZN" of the AOI circuit 400. The vertical conducting line 472, the via-connector 492, and the horizontal conducting line 462 are conductively connected together to carry an input signal "A2" of the AOI circuit 400. The vertical conducting line 474, the via-connector 494, and the horizontal conducting line 464 are conductively connected together to carry an input signal "A1" of the AOI circuit 400. The vertical conducting line 476, the via-connector 496, and the horizontal conducting line 466 are conductively connected together to carry an input signal "B1" of the AOI circuit 400. The vertical conducting line 478, the via-connector 498, and the horizontal conducting line 444 are conductively connected together to carry an input signal "B2" of the AOI circuit 400.

FIG. 4C is a cross-sectional view of the AOI circuit 400 as specified by FIG. 4A in a cutting plane A-A', in accordance with some embodiments. As shown in FIG. 4C, the semiconductor structure in the p-type active zone 80p is on the substrate 50. Each of the terminal-conductors 432p, 434p, 435p, 436p, and 438p intersects the semiconductor structure in the p-type active zone 80p. Each of the gate-conductors gA2, gA1, gB1, and gB2 also intersects the semiconductor structure in the p-type active zone 80p. In some embodiments, the active regions (such as, the source region, the channel region, or the drain region) in the p-type active zone 80p are isolated from the active regions in the adjacent cells, by the boundary isolation region 151i under the dummy gate-conductor 151 and the boundary isolation region 159i under the dummy gate-conductor 159. The horizontal conducting line 420 is conductively connected to each of the terminal-conductors 432p, 435p, and 438p through a corresponding via-connector VD.

FIG. 4D is a cross-sectional view of the AOI circuit 400 as specified by FIG. 4A in a cutting plane B-B', in accordance with some embodiments. As shown in FIG. 4D, the vertical conducting line 470 is conductively connected to the horizontal conducting line 442 though the via-connector 490. The horizontal conducting line 442 is conductively connected to each of the terminal-conductors 434p and 435n through a corresponding via-connector VD. The horizontal conducting line 442 crosses over the dummy gate-conductor 151 while extending in the negative X-direction. Furthermore, the vertical conducting line 478 is conductively connected to the horizontal conducting line 444 though the via-connector 498, and the horizontal conducting line 444 is conductively connected to the gate-conductor gB2 through a via-connector VG.

FIG. 4E is a cross-sectional view of the AOI circuit 400 as specified by FIG. 4A in a cutting plane C-C', in accordance with some embodiments. As shown in FIG. 4E, the semiconductor structure in the n-type active zone 80n is on the substrate 50. Each of the terminal-conductors 432n, 434n, 435n, 436n, and 438n intersects the semiconductor structure in the n-type active zone 80n. Each of the gate-conductors gA2, gA1, gB1, and gB2 also intersects the semiconductor structure in the n-type active zone 80n. In some embodiments, the active regions (such as, the source region, the channel region, or the drain region) in the p-type active zone 80p are isolated from the active regions in the adjacent cells, by the boundary isolation region 151i under the dummy gate-conductor 151 and the boundary isolation region 159i under the dummy gate-conductor 159. The vertical conducting line 472 is conductively connected to the horizontal conducting line 462 though the via-connector 492, and the horizontal conducting line 462 is conductively connected to the gate-conductor gA2 through a via-connector VG. The vertical conducting line 474 is conductively connected to the horizontal conducting line 464 though the via-connector 494, and the horizontal conducting line 464 is conductively connected to the gate-conductor gA1 through a via-connector VG. The vertical conducting line 476 is conductively connected to the horizontal conducting line 466 though the via-connector 496, and the horizontal conducting line 466 is conductively connected to the gate-conductor gB1 through a via-connector VG.

Figure 5:
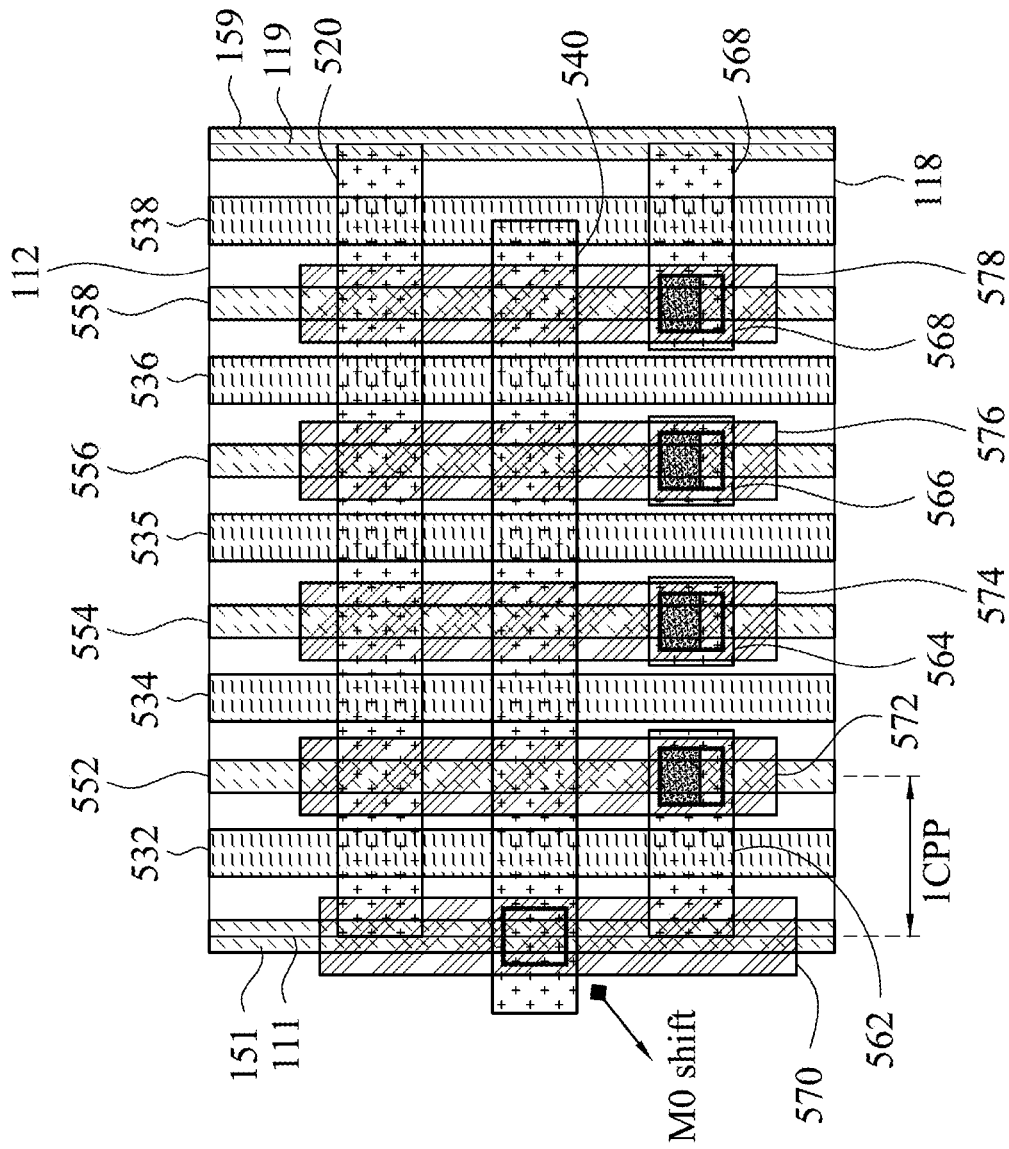
FIG. 5 is a partial layout diagram of IC circuits, in accordance with some embodiments.

FIG. 5 is a partial layout diagram of IC circuits, in accordance with some embodiments. The layout diagram of FIG. 5 includes the layout patterns for specifying gate-conductors (552, 554, 556, and 558) extending in the Y-direction, terminal-conductors (532, 534, 535, 536, and 538) extending in the Y-direction, and dummy gate-conductors (151 and 159) extending in the Y-direction. The layout diagram of FIG. 5 also includes the layout patterns for specifying horizontal conducting lines (520, 540, 562, 564, 566, and 568) extending in the X-direction, vertical conducting lines (570, 572, 574, 576, and 578) extending in the Y-direction, and various via-connectors. The IC circuits is in a cell that is bounded by four cell boundaries. The cell width extending in the X-direction is bounded by two vertical cell boundaries 111 and 119, and the cell height extending in the Y-direction is bounded by two horizontal cell boundaries 112 and 118.

In some embodiments, additional layout patterns are added to FIG. 5. For example, in some embodiments, the layout patterns for specifying the segmentation (i.e., the cutting) of the gate-conductors are added to FIG. 5. As another example, in some embodiments, the layout patterns for specifying the segmentation (i.e., the cutting) of the terminal-conductors are added to FIG. 5. As still another example, in some embodiments, additional layout patterns for specifying additional via-connectors are added to FIG. 5, when the IC circuits include more connections than what is already specified by the layout patterns in FIG. 5.

In the IC circuits as specified by the layout diagram of FIG. 5, the horizontal conducting lines (520, 540, 562, 564, 566, and 568) are in the first connection layer M0 immediately above the gate-conductors and the terminal-conductors, and some via-connectors directly connects various horizontal conducting lines with various gate-conductors and/or terminal-conductors. The vertical conducting lines (570, 572, 574, 576, and 578) are in the second connection layer M1, which overlies the interlayer dielectric (ILD) materials separating the second connection layer M1 and the first connection layer M0. Each of the vertical conducting lines (572, 574, 576, and 578) is correspondingly atop one of the gate-conductors (552, 554, 556, and 558), while the vertical conducting line 570 is atop the dummy gate-conductor 151.

In the IC circuits as specified by the layout diagram of FIG. 5, each of the horizontal conducting lines (562, 564, 566, and 568) is correspondingly connected to one of the gate-conductors (552, 554, 556, and 558) through a gate via-connector VG. Each of the vertical conducting lines (572, 574, 576, and 578) is correspondingly connected to one of the horizontal conducting lines (562, 564, 566, and 568) through a corresponding via-connector VIA0. The vertical conducting line 570 is connected to the horizontal conducting line 540 through a via-connector VIA0 at the vertical cell boundary 111 of the IC circuits. Each of the via-connectors VIA0 passes through the ILD materials separating the second connection layer M1 and the first connection layer M0. In some embodiments, each of the via-connectors VIA0 underneath a corresponding vertical conducting line provides the function of a pin-connector. In some embodiments, each pin-connector is configured to carry one of the input signals or one of the output signals of the IC circuits.

In the IC circuits as specified by the layout diagram of FIG. 5, the horizontal conducting line 540 is shifted towards one side of the circuit cell and passes the vertical cell boundary 111, which makes it possible to place a via-connector VIA0 at the intersection between the horizontal conducting line 540 and the vertical conducting line 570. Additionally, the shifting of the horizontal conducting line 540 towards one side of the circuit cell leaves an empty area near the other vertical cell boundary 119 at the opposite end of the horizontal conducting line 540. The empty area in the first connection layer M0 allows the adjacent cell to have a vertical conducting line positioned on the vertical cell boundary 119 and allows the adjacent cell to place a pin-connector at the vertical cell boundary 119 for the adjacent cell.

In the IC circuits as specified by the layout diagram of FIG. 5, in addition to feasibility of placing a pin-connector at one of the vertical cell boundaries, when each of the vertical conducting lines is atop one of the gate-conductors or dummy gate-conductors 151, the minimal width of the horizontal conducting lines extending in the X-direction can also be reduced to one CPP. The unit of one CPP is the pitch distance between two adjacent gate-conductors as shown in the figure.

Figure 6:
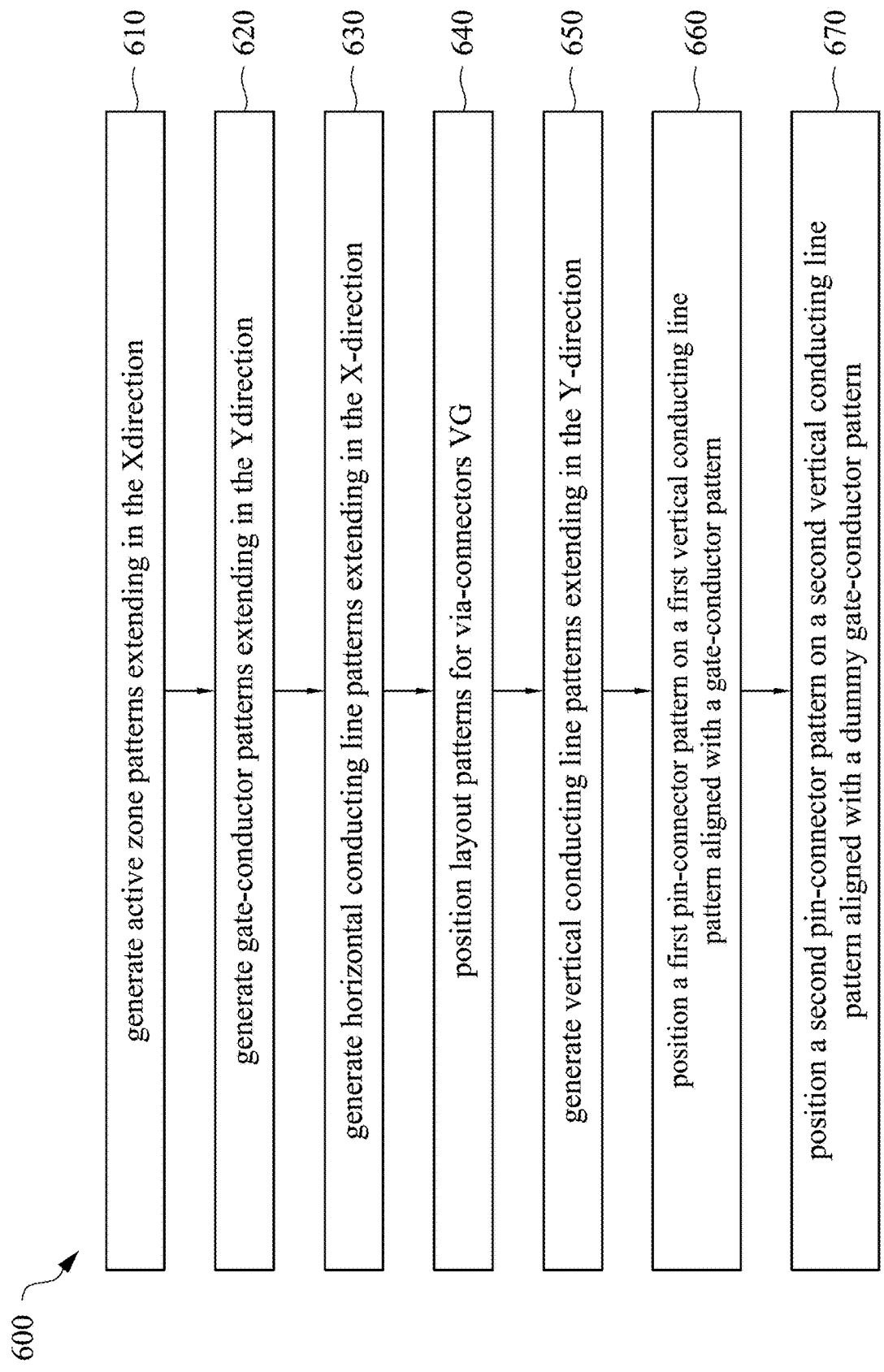
FIG. 6 is a flow chart of a method of generating a layout design of an integrated circuit by a processor, in accordance with some embodiments.

FIG. 6 is a flow chart of a method 600 of generating a layout design of an integrated circuit by a processor, in accordance with some embodiments. It is understood that additional operations may be performed before, during, and/or after the method 600 depicted in FIG. 6, and that some other processes may only be briefly described herein. In some embodiments, the method 600 is usable to generate one or more layout designs, such as the layout designs in FIG. 1A, FIG. 2A, FIG. 3A, FIG. 4A, and FIG. 5. In some embodiments, the method 600 is usable to form integrated circuits having similar structural relationships as among one or more of the elements in FIGS. 1C-1G, FIGS. 2C-2E, FIGS. 3C-3E, or FIGS. 4C-4E. In some embodiments, method 600 is performed by a processing device (e.g., processor 802 in FIG. 8) configured to execute instructions for generating one or more layout designs, such as the layout designs in FIG. 1A, FIG. 2A, FIG. 3A, FIG. 4A, and FIG. 5.

In operation 610 of method 600, active zone patterns extending in the X-direction are generated. The active zone patterns generated include a first-type active zone pattern and a second-type active zone pattern. In the example layout designs of FIG. 1A, FIG. 2A, FIG. 3A, FIG. 4A, and FIG. 5, the p-type active zone 80p extending in the X-direction is specified by a corresponding p-type active zone pattern, and n-type active zone 80n extending in the X-direction is specified by a corresponding n-type active zone pattern. After operation 610, the flow proceeds to operation 620.

In operation 620 of method 600, gate-conductor patterns extending in the Y-direction are generated. In the example layout design of FIG. 1A, the gate-conductor 155 is specified by a corresponding gate-conductor pattern extending in the Y-direction. In the example layout designs of FIG. 2A and FIG. 3A, each of the gate-conductors gA2 and gA1 is specified by a corresponding gate-conductor pattern extending in the Y-direction. In the example layout design of FIG. 4A, each of the gate-conductors gA2, gA1, gB1, and gB2 is specified by a corresponding gate-conductor pattern extending in the Y-direction. In the example layout design of FIG. 5, each of the gate-conductors 552, 554, 556, and 558 is specified by a corresponding gate-conductor pattern extending in the Y-direction. In the example layout designs of FIG. 1A, FIG. 2A, FIG. 3A, FIG. 4A, and FIG. 5, the gate-conductor patterns generated in operation 620 also include the layout patterns for the dummy gate-conductors 151 and 159. After operation 620, the flow proceeds to operation 630.

In operation 630 of method 600, horizontal conducting line patterns extending in the X-direction are generated. Examples of the horizontal conducting line patterns include the layout patterns for specifying the horizontal conducting lines (120, 140, and 160) in FIGS. 1A-1B, the layout patterns for specifying the horizontal conducting lines (220, 240, and 260) in FIGS. 2A-2B, the layout patterns for specifying the horizontal conducting lines (320, 340, and 360) in FIGS. 3A-3B, the layout patterns for specifying the horizontal conducting lines (420, 442, 444, 462, 464, and 466) in FIGS. 4A-4B, and the layout patterns for specifying the horizontal conducting lines (520, 540, 562, 564, 566, and 568) in FIG. 5. After operation 630, the flow proceeds to operation 640.

In operation 640 of method 600, via-connector patterns are positioned at selected intersections between the horizontal conducting line patterns and the gate-conductor patterns. In the example layout designs of FIG. 1A, FIG. 2A, FIG. 3A, FIG. 4A, and FIG. 5, the via-connector patterns at selected intersections between the horizontal conducting line patterns and the gate-conductor patterns are identified as the layout patterns for the gate via-connector VG. After operation 640, the flow proceeds to operation 650.

In operation 650 of method 600, vertical conducting line patterns extending in the Y-direction are generated. Examples of the vertical conducting line patterns include the layout patterns for specifying the vertical conducting lines (170 and 172) in FIGS. 1A-1B, the layout patterns for specifying the vertical conducting lines (270, 272, and 274) in FIGS. 2A-2B, the layout patterns for specifying the vertical conducting lines (370, 372, and 374) in FIGS. 3A-3B, the layout patterns for specifying the vertical conducting lines (470, 472, 474, 476, and 478) in FIGS. 4A-4B, and the layout patterns for specifying the vertical conducting lines (570, 572, 574, 576, and 578) in FIG. 5. After operation 650, the flow proceeds to operation 660.

In operation 660 of method 600, one or more pin-connector patterns are positioned on vertical conducting line patterns that are aligned with the gate-conductor patterns. Examples of the pin-connector patterns include the layout patterns for specifying the via-connector 192 in FIGS. 1A-1B, the layout patterns for specifying the via-connectors (292, and 294) in FIGS. 2A-2B, the layout patterns for specifying the via-connectors (392, and 394) in FIGS. 3A-3B, the layout patterns for specifying the via-connectors (492, 494, 496, and 498) in FIGS. 4A-4B, and the layout patterns for specifying the via-connectors VIA0 in FIG. 5. After operation 660, the flow proceeds to operation 670.

In operation 670 of method 600, a pin-connector pattern is positioned on a vertical conducting line pattern that is aligned with a dummy gate-conductor pattern. Examples of the pin-connector patterns include the layout patterns for specifying the via-connector 190 in FIGS. 1A-1B, the layout patterns for specifying the via-connector 290 in FIGS. 2A-2B, the layout patterns for specifying the via-connector 390 in FIGS. 3A-3B, and the layout patterns for specifying the via-connector 490 in FIGS. 4A-4B. Another example of the pin-connector pattern generated in operation 670 is the layout pattern for specifying the via-connector VIA0 at the intersection between the vertical conducting line 570 and the horizontal conducting line 540, as shown in FIG. 5.

In method 600, in some operations (which are no shown in FIG. 6), terminal-conductor patterns extending in the Y-direction are generated. Examples of the terminal-conductor patterns include the layout patterns for specifying terminal-conductors (132p, 132n, and 138) in FIGS. 1A-1B, the layout patterns for specifying terminal-conductors (232p, 232n, 235p, 235n, and 238) in FIGS. 2A-2B, the layout patterns for specifying terminal-conductors (332p, 332n, 335p, 335n, and 338) in FIGS. 3A-3B, the layout patterns for specifying terminal-conductors (432p, 432n, 434p, 434n, 435p, 435n, 436n, 438p, 438n) in FIGS. 4A-4B, and the layout patterns for specifying terminal-conductors (532, 534, 535, 536, and 538) in FIG. 5.

In method 600, operations 610-670 are performed in the order as indicated by the flowchart. The performance order for the operations 610-670 in the flowchart of FIG. 6 is provided as a non-limiting example. Other alternative performance orders for the operations 610-670 are within the contemplated scope of the present disclosure. For example, in some alternative embodiments, operation 670 is performed before operation 660.

Figure 7:
FIG. 7 is a flow chart of a method of fabricating an integrated circuit, in accordance with some embodiments.

FIG. 7 is a flow chart of a method 700 of fabricating an integrated circuit, in accordance with some embodiments. It is understood that additional operations may be performed before, during, and/or after the method 700 depicted in FIG. 7. In some embodiments, the method 700 is usable in the processes for fabricating one or more integrated circuits, such as the integrated circuits as specified by the layout designs in FIG. 1A, FIG. 2A, FIG. 3A, FIG. 4A, or FIG. 5. In some embodiments, the method 700 is usable in the processes for fabricating one or more integrated circuits having similar structural relationships as among one or more of the elements in FIGS. 1C-1G, FIGS. 2C-2E, FIGS. 3C-3E, or FIGS. 4C-4E.

In operation 710 of method 700, a first semiconductor structure is fabricated in a first-type active zone, and a second semiconductor structure is fabricated in a second-type active zone. Each of the first-type active zone and the second-type active zone extends in the X-direction. In the non-limiting examples of FIGS. 1C-1G, a first semiconductor structure for the p-type transistor T1p is fabricated in the p-type active zone 80p, and a second semiconductor structure for the n-type transistor T1n is fabricated in the n-type active zone 80n. After operation 710, the process flow proceeds to operation 720.

In operation 720 of method 700, one or more gate-conductors extending in the Y-direction are fabricate. Each of the gate-conductors intersects at least one of the first semiconductor structure and the second semiconductor structure. In the non-limiting examples of FIGS. 1C-1G, the gate-conductor 155 intersects both the semiconductor structure in the p-type active zone 80p and the semiconductor structure in the n-type active zone 80n. In some embodiments, in operation 720 of method 700, a dummy gate-conductor is fabricated and the dummy gate-conductor is aligned with the vertical boundary of the circuit cell. In the non-limiting examples of FIGS. 1C-1G, the dummy gate-conductor 151 is aligned with the vertical boundary 111 of the circuit cell. After operation 720, the process flow proceeds to operation 730.

In operation 730 of method 700, a first insulating material is deposited covering the gate-conductors. The first insulating material also covers the first semiconductor structure and the second semiconductor structure. Next, in operation 740 of method 700, a first metal layer is deposited over the first insulating material. Then, in operation 745 of method 700, the first metal layer is patterned to form horizontal conducting lines extending in the X-direction. In some embodiments, one of the horizontal conducting lines crosses a dummy gate-conductor at a vertical boundary. In the non-limiting examples of FIGS. 1C-1G, the horizontal conducting lines 120, 140, and 160 are formed in the first metal layer M0, and the horizontal conducting line 140 crosses the dummy gate-conductor 151 at the vertical boundary 111. After operation 740, in operation 750 of method 700, a second insulating material is deposited overlying the first metal layer.

Next, in operation 760 of method 700, a second metal layer is deposited over the second insulating material. Then, in operation 765 of method 700, the second metal layer is patterned to form vertical conducting lines extending in the Y-direction. A first one of the vertical conducting lines is aligned with a first gate-conductor underneath and directly connected to a first horizontal conducting line through a first pin-connector. A second one of the vertical conducting lines is aligned with a vertical boundary of a circuit cell and directly connected to a second horizontal conducting line through a second pin-connector. In some embodiments, one of the vertical conducting lines is aligned with a dummy gate-conductor underneath at the vertical boundary of the circuit cell. In the non-limiting examples of FIGS. 1C-1G, vertical conducting lines 172 and 170 are formed in the second metal layer M1. The vertical conducting line 172 is aligned with the gate-conductor 155, and the vertical conducting lines 170 is aligned with the dummy gate-conductor 151 at the vertical boundary 111. The vertical conducting line 172 is conductively connected to the horizontal conducting line 120 though the via-connector 192, and the vertical conducting line 170 is conductively connected to the horizontal conducting line 140 though the via-connector 190.

Figure 8:
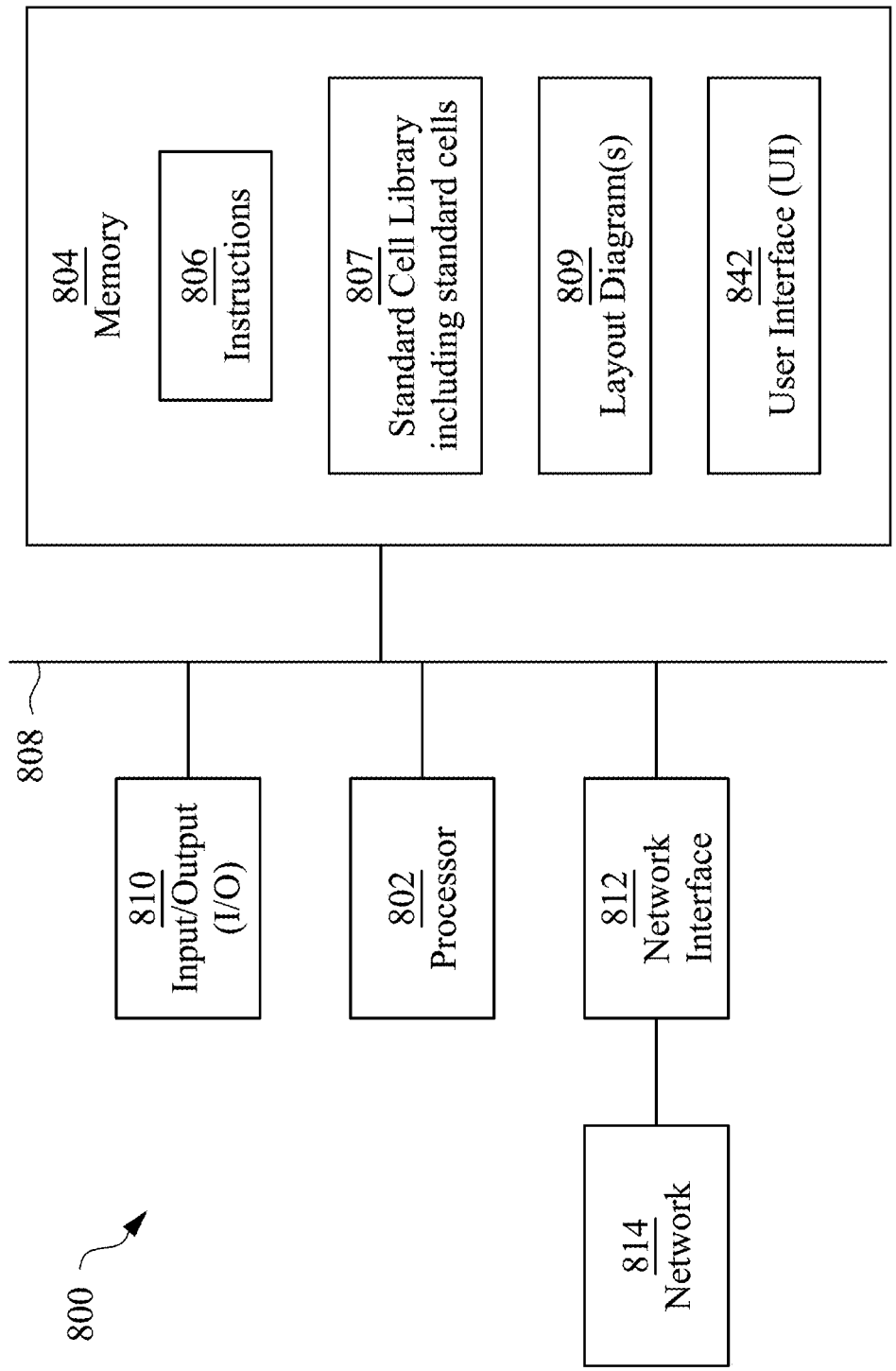
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an APR system. Methods described herein of designing layout diagrams represent wire routing arrangements, in accordance with one or more embodiments, are implementable, for example, using EDA system 800, in accordance with some embodiments.

In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of the methods described herein in accordance with one or more embodiments (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores library 807 of standard cells including such standard cells as disclosed herein. In one or more embodiments, storage medium 804 stores one or more layout diagrams 809 corresponding to one or more layouts disclosed herein.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
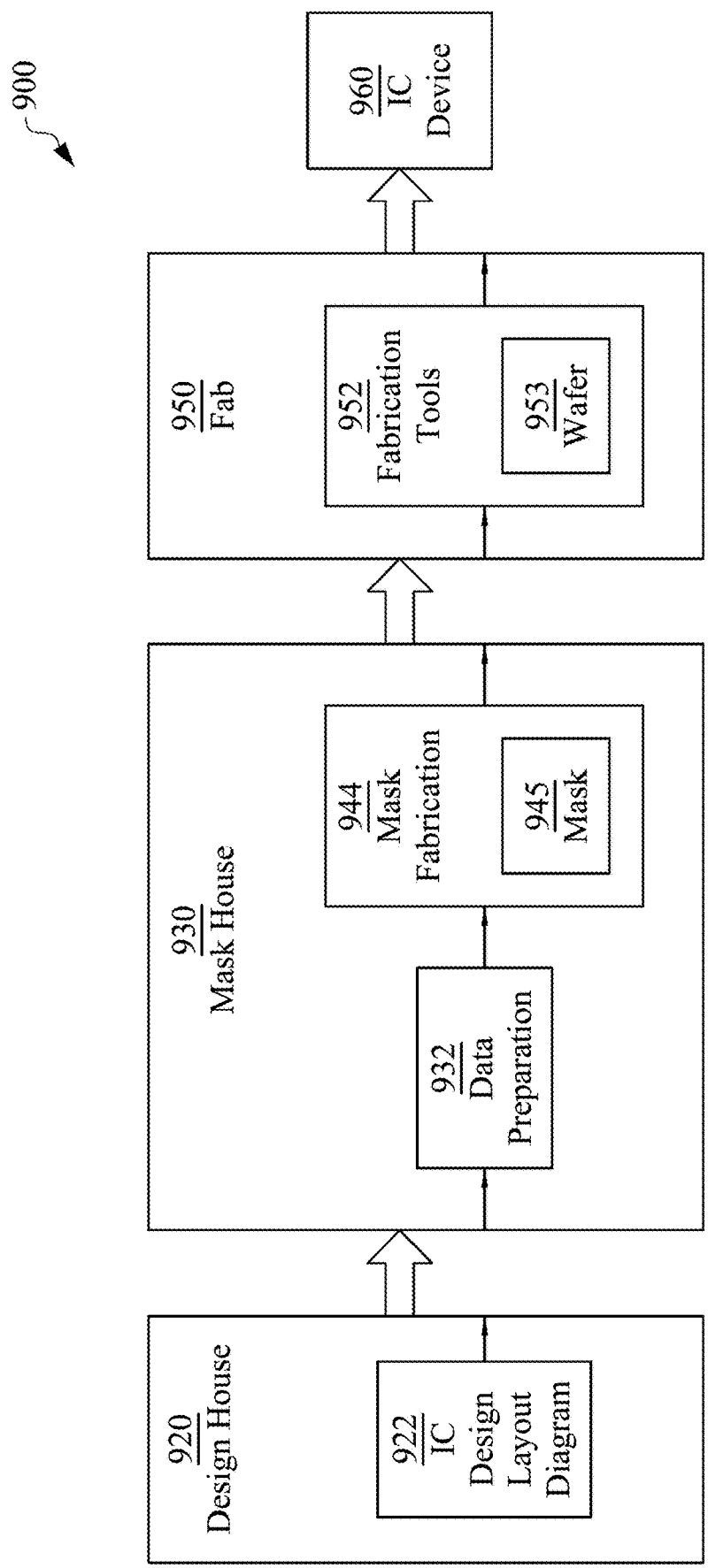
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discus sed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to a method. The method includes fabricating a first semiconductor structure in a first-type active zone and a second semiconductor structure in a second-type active zone. Each of the first semiconductor structure and the second semiconductor structure extending in a first direction. The method includes fabricating gate-conductors each extending in a second direction. Each of the gate-conductors intersects at least one of the first semiconductor structure or the second semiconductor structure. The second direction is perpendicular to the first direction. The method includes depositing a first insulating material covering the first semiconductor structure, the second semiconductor structure, and the gate-conductors. The method includes depositing a first metal layer over the first insulating material and patterning the first metal layer to form horizontal conducting lines extending in the first direction. The method includes depositing a second insulating material overlying the first metal layer, depositing a second metal layer over the second insulating material, and patterning the second metal layer to form vertical conducting lines extending in the second direction. A first vertical conducting line is aligned with a first gate-conductor underneath and directly connected to a first horizontal conducting line through a first pin-connector. A second vertical conducting line is aligned with a vertical boundary of a circuit cell and directly connected to a second horizontal conducting line through a second pin-connector.

Another aspect of the present disclosure relates to a method. The method includes fabricating gate-conductors extending in a second direction intersecting a semiconductor structure at channel regions of transistors. The second direction is perpendicular to a first direction. The method includes depositing a first insulating material covering the semiconductor structure and the gate-conductors, depositing a first metal layer over the first insulating material, and patterning the first metal layer to form horizontal conducting lines extending in the first direction. The method includes fabricating a first pin-connector and a second pin-connector passing through a second insulating material overlying the first metal layer, depositing a second metal layer over the second insulating material, and patterning the second metal layer to form vertical conducting lines extending in the second direction. A first vertical conducting line is aligned with a first gate-conductor underneath and directly connected to a first horizontal conducting line through the first pin-connector, and a second vertical conducting line is aligned with a vertical boundary of a circuit cell and directly connected to a second horizontal conducting line through the second pin-connector.

Still another aspect of the present disclosure relates to a method. The method includes fabricating two dummy gate-conductors intersecting a semiconductor structure extending in a first direction and fabricating a gate-conductor intersecting the semiconductor structure at a channel region of a transistor. The gate-conductor extending in a second direction is between the two dummy gate-conductors extending in the second direction which is perpendicular to the first direction. The method includes depositing a first insulating material covering the semiconductor structure, two dummy gate-conductors and the gate-conductor, depositing a first metal layer over the first insulating material, and patterning the first metal layer to form horizontal conducting lines extending in the first direction. The method includes depositing a second insulating material overlying the first metal layer, depositing a second metal layer over the second insulating material, and patterning the second metal layer to form vertical conducting lines extending in the second direction. A first vertical conducting line is aligned with the gate-conductor underneath and directly connected to a first horizontal conducting line through a first pin-connector, a second vertical conducting line is aligned with one of the two dummy gate-conductors and directly connected to a second horizontal conducting line through a second pin-connector.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A method comprising:
fabricating a first semiconductor structure in a first-type active zone and a second semiconductor structure in a second-type active zone, wherein each of the first semiconductor structure and the second semiconductor structure extend in a first direction;
fabricating gate-conductors each extending in a second direction, wherein each of the gate-conductors intersects at least one of the first semiconductor structure or the second semiconductor structure in a plan view, and wherein the second direction is perpendicular to the first direction;
depositing a first insulating material covering the first semiconductor structure, the second semiconductor structure, and the gate-conductors;
depositing a first metal layer over the first insulating material and patterning the first metal layer to form horizontal conducting lines extending in the first direction;
depositing a second insulating material overlying the patterned first metal layer; and
depositing a second metal layer over the second insulating material and patterning the second metal layer to form vertical conducting lines extending in the second direction, wherein a first vertical conducting line is aligned with a first gate-conductor underneath and directly connected to a first horizontal conducting line through a first pin-connector, and wherein a second vertical conducting line is aligned with a vertical boundary of a circuit cell and directly connected to a second horizontal conducting line through a second pin-connector.

2. The method of claim 1, wherein the patterning the first metal layer to form horizontal conducting lines comprises:
arranging the second horizontal conducting line to cross the vertical boundary of the circuit cell.

3. The method of claim 1, wherein the patterning the second metal layer to form vertical conducting lines comprises:
arranging each of the vertical conducting lines between two vertical boundaries of the circuit cell in alignment with a corresponding gate-conductor underneath.

4. The method of claim 1, wherein fabricating the gate-conductors comprises:
fabricating a dummy gate-conductor aligned with the vertical boundary of the circuit cell.

5. The method of claim 4, wherein the patterning the second metal layer to form vertical conducting lines comprises:
aligning the second vertical conducting line with the dummy gate-conductor.

6. The method of claim 4, wherein the patterning the first metal layer to form horizontal conducting lines comprises:
arranging the second horizontal conducting line to cross the dummy gate-conductor in the plan view.

7. A method comprising:
fabricating gate-conductors extending in a second direction that intersects a semiconductor structure at channel regions of transistors, wherein the second direction is perpendicular to a first direction;
depositing a first insulating material covering the semiconductor structure and the gate-conductors;

depositing a first metal layer over the first insulating material and patterning the first metal layer to form horizontal conducting lines extending in the first direction;

fabricating a first pin-connector and a second pin-connector passing through a second insulating material overlying the patterned first metal layer; and depositing a second metal layer over the second insulating material and patterning the second metal layer to form vertical conducting lines extending in the second direction, wherein a first vertical conducting line is aligned with a first gate-conductor underneath and directly connected to a first horizontal conducting line through the first pin-connector, and wherein a second vertical conducting line is aligned with a vertical boundary of a circuit cell and directly connected to a second horizontal conducting line through the second pin-connector.

8. The method of claim 7, comprising
fabricating terminal-conductors extending in the second direction that intersects the semiconductor structure at a source region or a drain region of one of the transistors.

9. The method of claim 8, comprising:
fabricating a via-connector directly connecting one of the horizontal conducting lines with one of the gate-conductors or with one of the terminal-conductors.

10. The method of claim 7, wherein the patterning the first metal layer to form horizontal conducting lines comprises:
arranging the second horizontal conducting line to cross the vertical boundary of the circuit cell.

11. The method of claim 7, wherein the patterning the second metal layer to form vertical conducting lines comprises:
arranging each of the vertical conducting lines between two vertical boundaries of the circuit cell in alignment with a corresponding gate-conductor underneath.

12. The method of claim 7, wherein fabricating the gate-conductors comprises:
fabricating a dummy gate-conductor aligned with the vertical boundary of the circuit cell.

13. The method of claim 12, wherein the patterning the second metal layer to form vertical conducting lines comprises:
aligning the second vertical conducting line with the dummy gate-conductor.

14. The method of claim 12, wherein the patterning the first metal layer to form horizontal conducting lines comprises:
arranging the second horizontal conducting line to cross the dummy gate-conductor in the plan view.

15. A method comprising:
fabricating two dummy gate-conductors and a gate-conductor such that in a plan view, the two dummy gate-conductors intersect a semiconductor structure extending in a first direction and the gate-conductor intersects the semiconductor structure at a channel region of a transistor, wherein the gate-conductor extending in a second direction is between the two dummy gate-conductors extending in the second direction which is perpendicular to the first direction;

depositing a first insulating material covering the semiconductor structure, two dummy gate-conductors and the gate-conductor;

depositing a first metal layer over the first insulating material and patterning the first metal layer to form horizontal conducting lines extending in the first direction;

depositing a second insulating material overlying the patterned first metal layer; and depositing a second metal layer over the second insulating material and patterning the second metal layer to form vertical conducting lines extending in the second direction, wherein a first vertical conducting line is aligned with the gate-conductor underneath and directly connected to a first horizontal conducting line through a first pin-connector, and wherein a second vertical conducting line is aligned with one of the two dummy gate-conductors and directly connected to a second horizontal conducting line through a second pin-connector.

16. The method of claim 15, comprising
fabricating a terminal-conductor extending in the second direction between the two dummy gate-conductors to intersect the semiconductor structure in a plan view at a source region or a drain region of the transistor; and
fabricating a via-connector directly connecting one of the horizontal conducting lines with the gate-conductor or with the terminal-conductor.

17. The method of claim 15, wherein the patterning the first metal layer to form horizontal conducting lines comprises:
arranging the second horizontal conducting line such as to cross one of the two dummy gate-conductors in a plan view.

18. The method of claim 15, wherein the patterning the second metal layer to form vertical conducting lines comprises:
arranging one of vertical conducting lines in alignment with a corresponding gate-conductor underneath.

19. The method of claim 15, wherein fabricating the two dummy gate-conductors comprises:
fabricating one of the dummy gate-conductors aligned with a vertical boundary of a circuit cell.

20. The method of claim 18, wherein the patterning the first metal layer to form horizontal conducting lines comprises:
arranging the second horizontal conducting line such as to cross one of the dummy gate-conductors in a plan view.

\* \* \* \* \*